(12) United States Patent
Hatakeyama et al.

(10) Patent No.: US 9,023,587 B2
(45) Date of Patent: May 5, 2015

(54) NEGATIVE RESIST COMPOSITION AND PATTERNING PROCESS

(71) Applicant: Shin-Etsu Chemical Co., Ltd., Tokyo (JP)

(72) Inventors: Jun Hatakeyama, Joetsu (JP); Koji Hasegawa, Joetsu (JP); Daisuke Domon, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 14/138,165

(22) Filed: Dec. 23, 2013

(65) Prior Publication Data

US 2014/0212810 A1 Jul. 31, 2014

(30) Foreign Application Priority Data

Jan. 29, 2013 (JP) .................................. 2013-013960

(51) Int. Cl.

| | | |
|---|---|---|
| *G03F 7/004* | (2006.01) | |
| *G03F 7/32* | (2006.01) | |
| *G03F 7/038* | (2006.01) | |
| *C08F 220/18* | (2006.01) | |
| *C08F 20/16* | (2006.01) | |
| *C08F 18/04* | (2006.01) | |

(52) U.S. Cl.
CPC ............... *G03F 7/322* (2013.01); *C08F 20/16* (2013.01); *C08F 220/18* (2013.01); *C08F 18/04* (2013.01); *G03F 7/0046* (2013.01); *G03F 7/0382* (2013.01); *Y10S 430/128* (2013.01)

(58) Field of Classification Search
USPC ............... 430/270.1, 325, 927; 526/242, 313, 526/319, 326, 347.1, 280, 329.2, 329.7
See application file for complete search history.

(56) References Cited

U.S. PATENT DOCUMENTS

| | | | |
|---|---|---|---|
| 6,746,817 B2 | 6/2004 | Takeda et al. | |
| 6,939,662 B2 * | 9/2005 | Mizutani et al. | ........... 430/270.1 |
| 7,537,880 B2 | 5/2009 | Harada et al. | |
| 2008/0090172 A1 | 4/2008 | Hatakeyama et al. | |
| 2009/0269696 A1 * | 10/2009 | Ohsawa et al. | ........... 430/270.1 |
| 2010/0143830 A1 * | 6/2010 | Ohashi et al. | ..................... 430/5 |
| 2011/0287234 A1 * | 11/2011 | Tsuchihashi et al. | ...... 428/195.1 |
| 2013/0209922 A1 * | 8/2013 | Masunaga et al. | ................. 430/5 |

FOREIGN PATENT DOCUMENTS

| | | | |
|---|---|---|---|
| EP | 1319981 A2 * | 6/2003 | |
| EP | 1367440 A2 * | 12/2003 | |
| JP | 04082860 A * | 3/1992 | |
| JP | 04164041 A * | 6/1992 | |
| JP | 2006-169302 A | 6/2006 | |
| JP | 3865048 B2 | 1/2007 | |
| JP | 2008-111103 A | 5/2008 | |
| JP | 2008-122932 A | 5/2008 | |
| JP | 2008197606 A * | 8/2008 | |
| JP | 2008249951 A * | 10/2008 | |

OTHER PUBLICATIONS

Machine translation of JP 2008-197606 (no date).*

* cited by examiner

*Primary Examiner* — Amanda C Walke

(74) *Attorney, Agent, or Firm* — Westerman, Hattori, Daniels & Adrian, LLP

(57) ABSTRACT

A polymer comprising recurring units (a) of styrene having an HFA group and an ester group adjacent thereto and recurring units (b) having a hydroxyl group is used as base resin to formulate a negative resist composition. The negative resist composition has a high dissolution contrast in alkaline developer, high sensitivity, high resolution, good pattern profile after exposure, and a suppressed acid diffusion rate.

9 Claims, No Drawings

NEGATIVE RESIST COMPOSITION AND PATTERNING PROCESS

CROSS-REFERENCE TO RELATED APPLICATION

This non-provisional application claims priority under 35 U.S.C. §119(a) on Patent Application No. 2013-013960 filed in Japan on Jan. 29, 2013, the entire contents of which are hereby incorporated by reference.

TECHNICAL FIELD

This invention relates to a negative resist composition, and more particularly to a chemically amplified negative resist composition comprising a specific polymer; and a negative pattern forming process using the same.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, extreme ultraviolet (EUV) lithography of 13.5 nm wavelength, and double patterning version of the ArF lithography, on which active research efforts have been made.

With respect to high-energy radiation of very short wavelength such as electron beam (EB) or x-ray, hydrocarbons and similar light elements used in resist materials have little absorption. Then polyhydroxystyrene base resist materials are under consideration.

The exposure system for mask manufacturing made a transition from the laser beam exposure system to the EB exposure system to increase the accuracy of line width. Since a further size reduction becomes possible by increasing the accelerating voltage of the electron gun in the EB exposure system, the accelerating voltage increased from 10 kV to 30 kV and reached 50 kV in the current mainstream system, with a voltage of 100 kV being under investigation.

As the accelerating voltage increases, a lowering of sensitivity of resist film becomes of concern. As the accelerating voltage increases, the influence of forward scattering in a resist film becomes so reduced that the contrast of electron image writing energy is improved to ameliorate resolution and dimensional control whereas electrons can pass straightforward through the resist film, indicating that the resist film becomes less sensitive. Since the mask exposure tool is designed for exposure by direct continuous writing, a lowering of sensitivity of resist film leads to an undesirably reduced throughput. Due to a need for higher sensitivity, chemically amplified resist compositions are contemplated.

Thinning of resist film is in progress to facilitate reduction of pattern feature in the EB lithography for mask manufacturing and to prevent the pattern from collapsing due to a higher aspect ratio during development. In the case of photolithography, a thinning of resist film greatly contributes to resolution improvement. This is because introduction of chemical mechanical polishing (CMP) or the like has driven forward device planarization. In the case of mask manufacture, substrates are flat, and the thickness of processable substrates (e.g., Cr, MoSi or $SiO_2$) is predetermined by a percent light shield or phase shift control. The dry etch resistance of resist film must be improved before the film can be reduced in thickness.

It is generally believed that there is a correlation between the carbon density and the dry etch resistance of resist film. For EB writing which is not affected by absorption, resist materials based on novolak resins having better etch resistance have been developed. For etch resistance improvement, styrene copolymers were first proposed, and then indene copolymers and acenaphthylene copolymers were disclosed in Patent Documents 1 and 2, respectively. They are believed to have improved etch resistance due to a high carbon density and a robust main chain structure based on cycloolefin structure.

Citation List

Patent Document 1: JP 3865048
Patent Document 2: JP-A 2006-169302

DISCLOSURE OF INVENTION

An object of the present invention is to provide a negative resist composition, typically chemically amplified negative resist composition, comprising a specific polymer, which exhibits a high resolution surpassing prior art negative resist compositions based on hydroxystyrene and novolak resins, and forms a resist film having a good pattern profile after exposure; and a pattern forming process using the same.

In one aspect, the invention provides a negative resist composition comprising a polymer comprising recurring units (a) and hydroxyl-containing recurring units (b), represented by the general formula (1) as base resin.

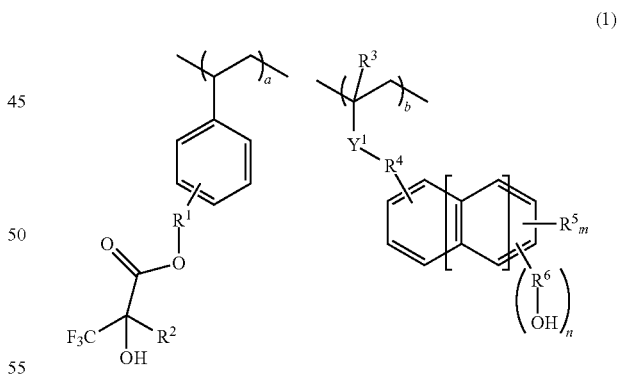

Herein $R^1$ is a straight $C_1$-$C_4$ alkylene group, $R^2$ is hydrogen, methyl or trifluoromethyl, $R^3$ is hydrogen or methyl, $Y^1$ is a single bond, —C(=O)—O— or —C(=O)—NH—, $R^4$ is a single bond or a straight or branched $C_1$-$C_6$ alkylene group, $R^5$ is hydrogen, fluorine, trifluoromethyl, cyano, or a straight, branched or cyclic $C_1$-$C_6$ alkyl, alkoxy, alkoxycarbonyl, acyl or acyloxy group, $R^6$ is a single bond or a straight, branched or cyclic $C_1$-$C_{12}$ alkylene group, m is an integer of 0 to 4, n is 1 or 2, a and b are in the range: $0<a<1.0$ and $0<b<1.0$.

Typically, the polymer has a weight average molecular weight of 1,000 to 500,000.

In a preferred embodiment, the resist composition further comprises an acid generator, the resist composition being a chemically amplified resist composition. The resist composition may further comprise one or more of an organic solvent, basic compound, dissolution regulator, surfactant, and crosslinker.

In another aspect, the invention provides a pattern forming process comprising the steps of applying the negative resist composition defined above onto a substrate, prebaking the composition to form a resist film, exposing a selected region of the resist film to high-energy radiation, and developing the exposed film in a developer to form a negative pattern wherein the unexposed region of resist film is dissolved away and the exposed region of resist film is not dissolved. The developer is typically an alkaline aqueous solution.

If desired, the process may further comprise extra steps like PEB prior to the development step, and the development step may be followed by additional steps like etching, resist removal and cleaning.

Through the steps of exposure to high-energy radiation and development, the negative resist composition exhibits a high sensitivity and high resolution and forms a negative pattern of resist film having very high etch resistance. By virtue of these advantages, the composition has satisfactory practical utility and finds application as a fine pattern-forming material for the fabrication of VLSIs or photomasks.

Since the alkaline dissolution rate of the polymer may be adjusted by changing the proportion of hydroxyl-containing recurring units (b), it is possible to formulate a negative resist composition having an appropriate alkaline dissolution rate for a particular application.

ADVANTAGEOUS EFFECTS OF INVENTION

The negative resist composition has advantages including a high dissolution contrast in alkaline developer, high sensitivity, high resolution, good pattern profile after exposure, and suppressed acid diffusion rate. There is available a negative resist composition which is suited as a fine pattern-forming material for the fabrication of VLSIs or photomasks. The negative resist composition, typically chemically amplified negative resist composition is used not only in the lithography for forming semiconductor circuits, but also in the formation of mask circuit patterns, micromachines, and thin-film magnetic head circuits.

DESCRIPTION OF EMBODIMENTS

The singular forms "a," "an" and "the" include plural referents unless the context clearly dictates otherwise. The notation "$C_n$—$C_m$" means a group containing from n to m carbon atoms per group.

The abbreviations have the following meaning.
EB: electron beam
EUV: extreme ultraviolet
PAG: photoacid generator
PEB: post-exposure bake
LER: line edge roughness
LWR: line width roughness
Mw: weight average molecular weight
Mn: number average molecular weight
Mw/Mn: dispersity or average molecular weight distribution
GPC: gel permeation chromatography The inventors made investigations to seek for a negative resist composition having a high sensitivity, high resolution, and exposure latitude, which is desired in the art.

In the effort to enhance the dissolution contrast of a negative resist film in an alkaline developer, a focus is first placed on a recurring unit having a 1,1,1,3,3,3-hexafluoro-2-propanol (HFA) group as the unit having a higher alkaline dissolution rate than hydroxystyrene. Since 4-HFA-styrene has a higher alkaline dissolution rate than 4-hydroxystyrene, a high dissolution contrast is expectable. However, since the HFA group does not undergo crosslinking reaction, the HFA group, if used alone, cannot be applied to negative resist compositions of the crosslinking type. It is recommended to enhance dissolution contrast by introducing a small amount of a group capable of enhancing an alkaline dissolution rate while keeping a phenolic hydroxyl-containing recurring unit. Although 4-styrenecarboxylic acid can become a recurring unit having a very high alkaline dissolution rate, the carboxyl group is undesirable because it causes swell in alkaline developer.

The inventors have found that a recurring unit of styrene having an HFA group and an ester group adjacent thereto is effective. This unit offers a higher alkaline dissolution rate than HFA styrene because the acidity of hydroxyl moiety of the HFA group is increased by the electron-attracting effect of the ester group. In addition, pattern collapse inherent to negative resist film rarely occurs because the unit has a high alkaline dissolution rate, but does not cause swell.

Based on the foregoing, the inventors have discovered that a polymer comprising recurring units of styrene having an ester group bonded to a 1,1,1,3,3,3-hexafluoro-2-propanol (HFA) group is useful as base resin in a negative resist composition, and that the resulting negative resist composition, especially chemically amplified negative resist composition exhibits a high sensitivity, high resolution, good pattern profile after exposure, and improved etch resistance and is thus suited as a fine pattern-forming material for the fabrication of VLSIs or photomasks.

Specifically, the negative resist composition is defined as comprising a polymer comprising recurring units (a) of styrene having an ester group bonded to a 1,1,1,3,3,3-hexafluoro-2-propanol (HFA) group and recurring units (b) having a hydroxyl group, represented by the general formula (1).

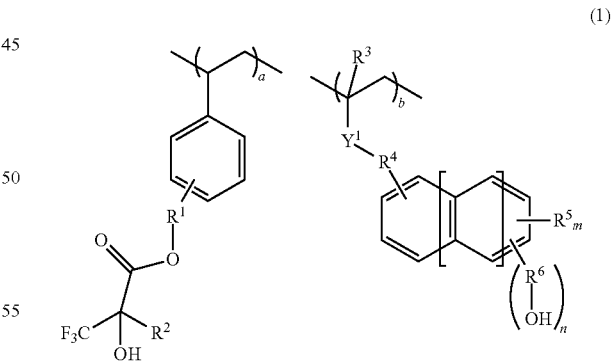

(1)

Herein $R^1$ is a straight $C_1$-$C_4$ alkylene group, $R^2$ is hydrogen, methyl or trifluoromethyl, $R^3$ is hydrogen or methyl, $Y^1$ is a single bond, —C(=O)—O— or —C(=O)—NH—, $R^4$ is a single bond or a straight or branched $C_1$-$C_6$ alkylene group, $R^5$ is hydrogen, fluorine, trifluoromethyl, cyano, or a straight, branched or cyclic $C_1$-$C_6$ alkyl, alkoxy, alkoxycarbonyl, acyl or acyloxy group, $R^6$ is a single bond or a straight, branched or cyclic $C_1$-$C_{12}$ alkylene group, m is an integer of 0 to 4, n is 1 or 2, a and b are in the range: 0<a<1.0 and 0<b<1.0.

The negative resist composition has a high sensitivity, high resolution, exposure latitude, process adaptability, good pattern profile after exposure, a minimal proximity bias (i.e., minimal size difference between grouped and isolated patterns), and improved etch resistance. By virtue of these advantages, the composition is fully useful in commercial application and is best suited as the resist material for the fabrication of VLSIs and mask pattern-forming material.

Examples of the styrene having an ester group bonded to an HFA group, from which recurring units (a) in formula (1) are derived, are shown below.

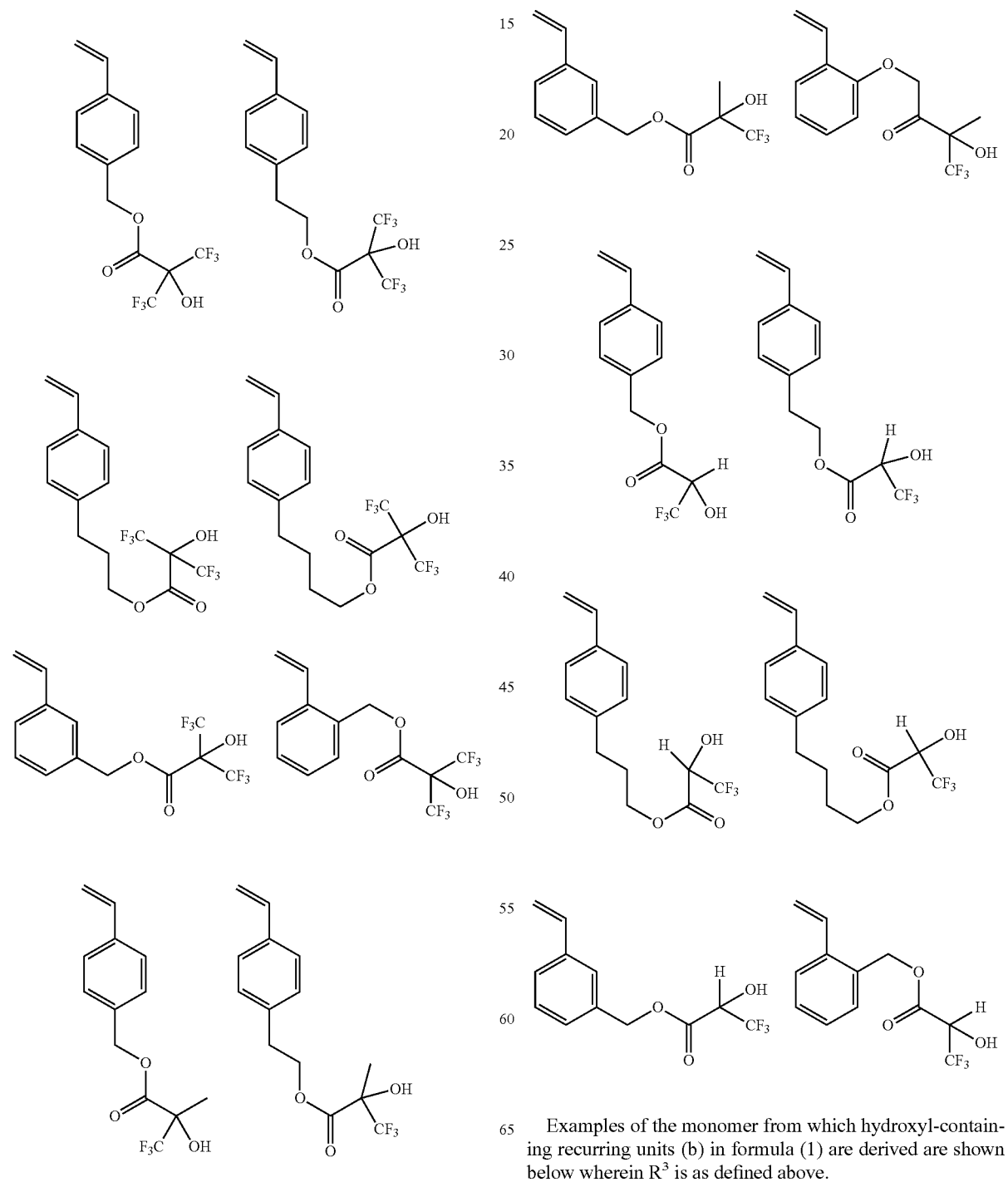

Examples of the monomer from which hydroxyl-containing recurring units (b) in formula (1) are derived are shown below wherein $R^3$ is as defined above.

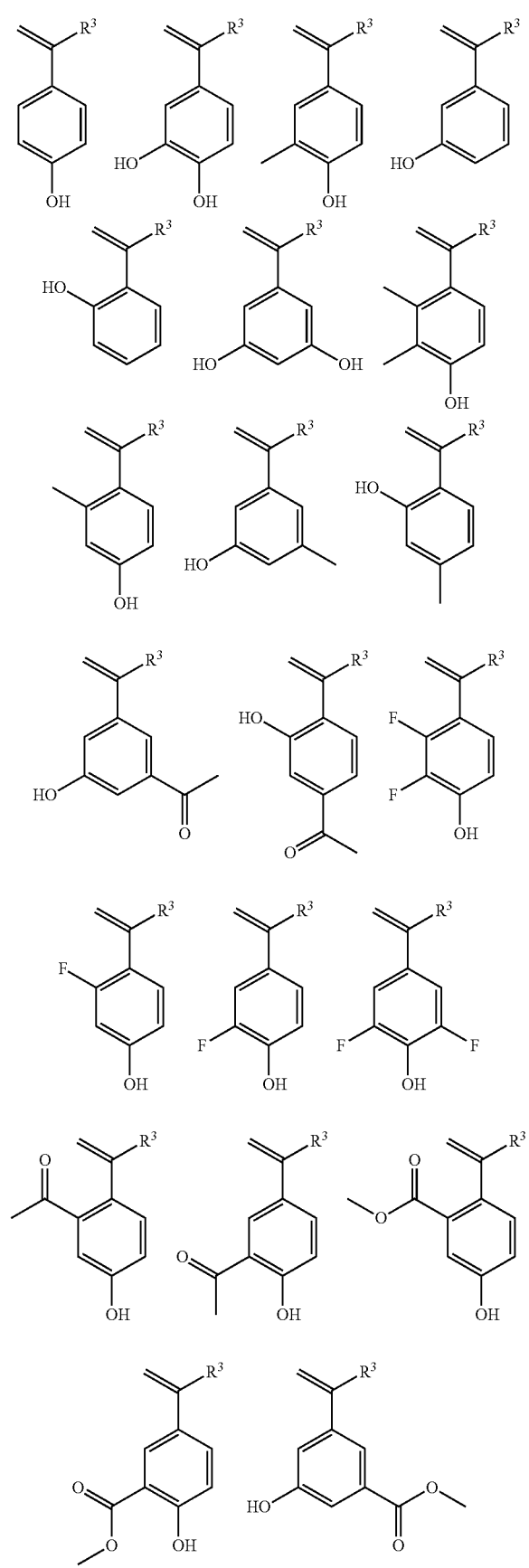
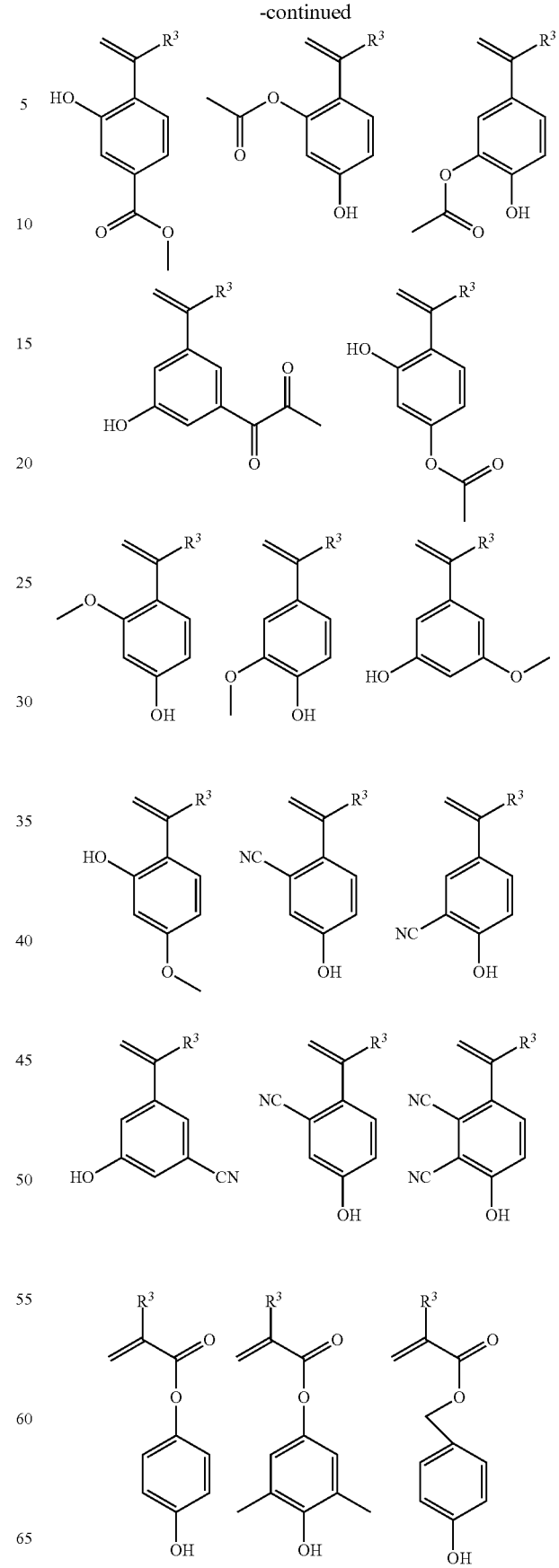

-continued
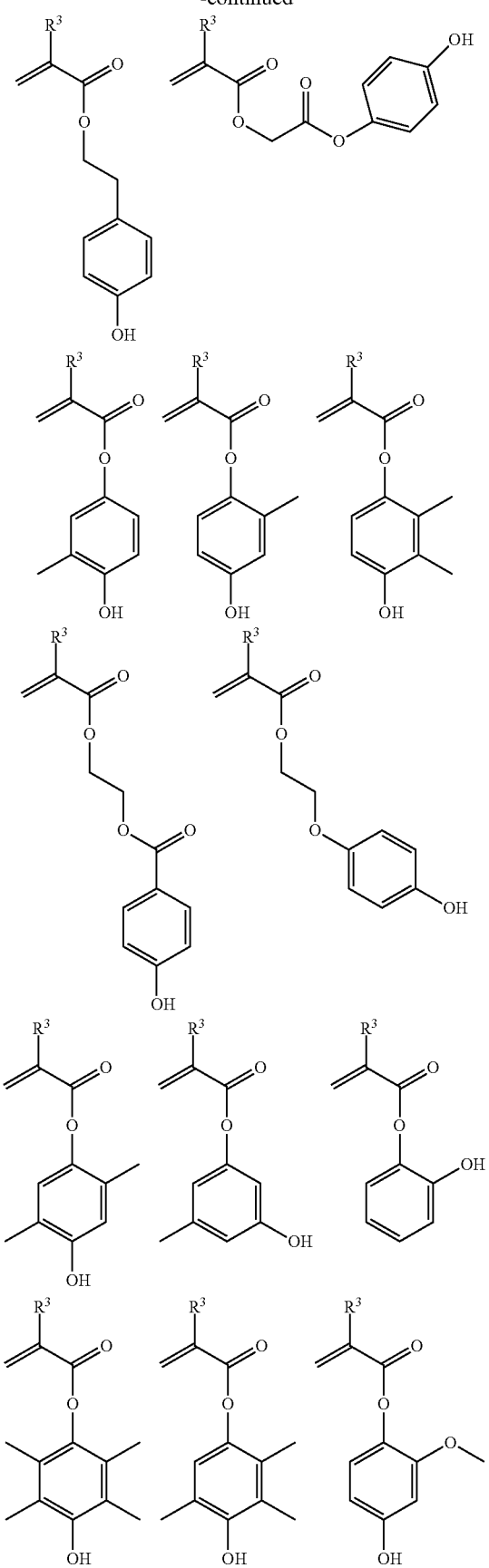
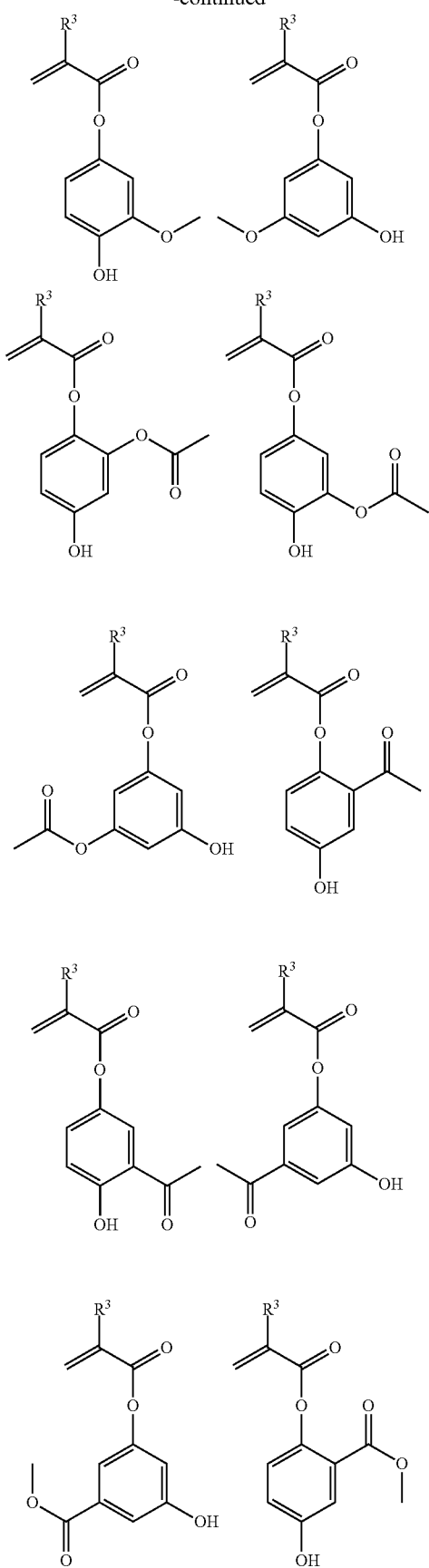

-continued
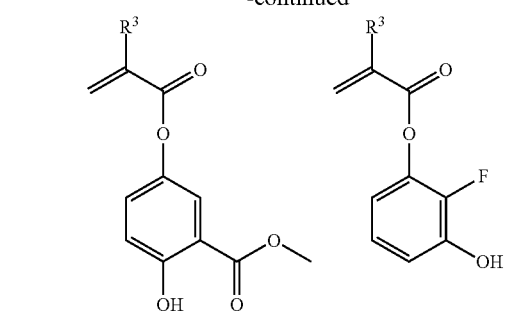
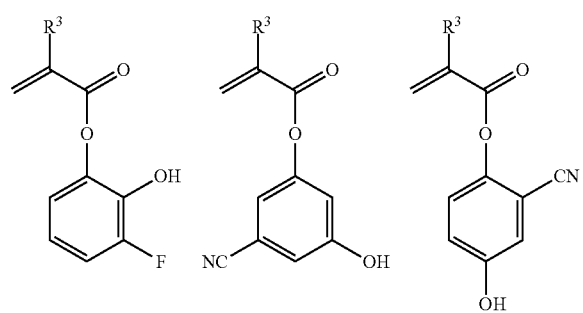
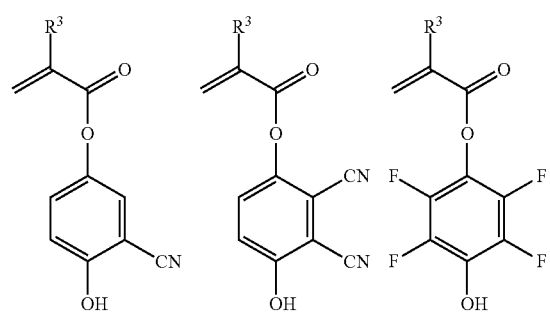
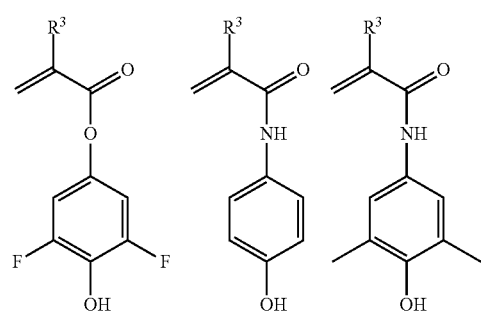
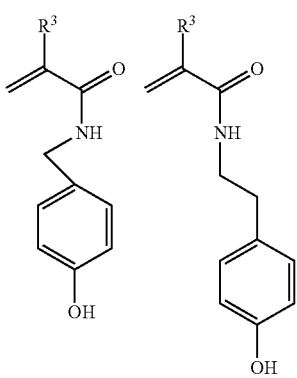
-continued
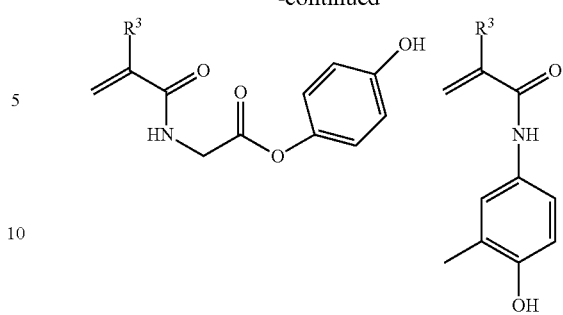
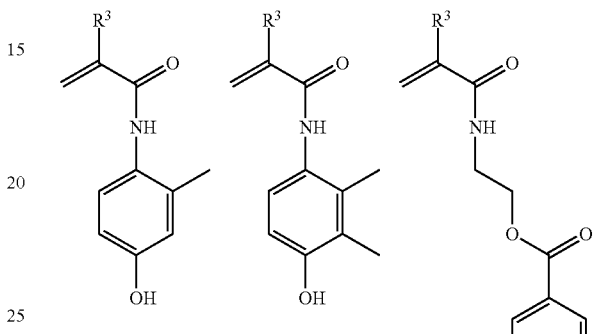
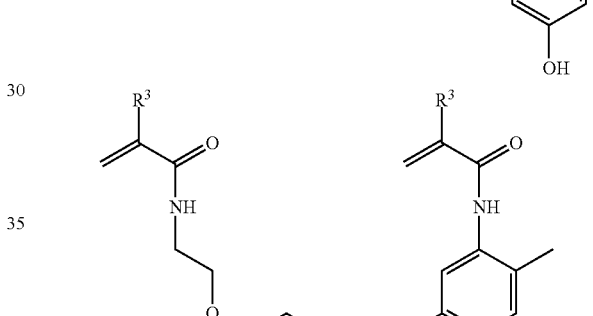
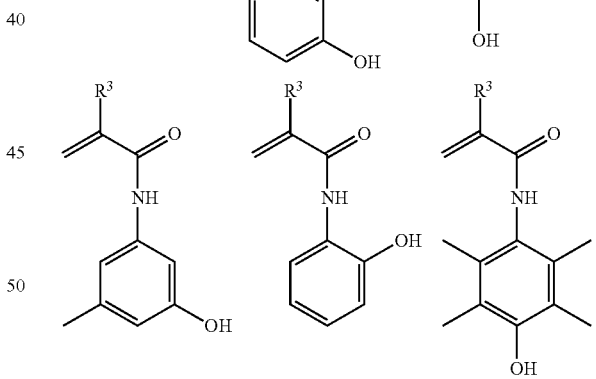
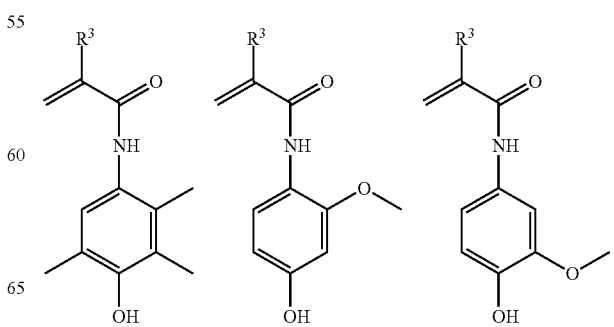

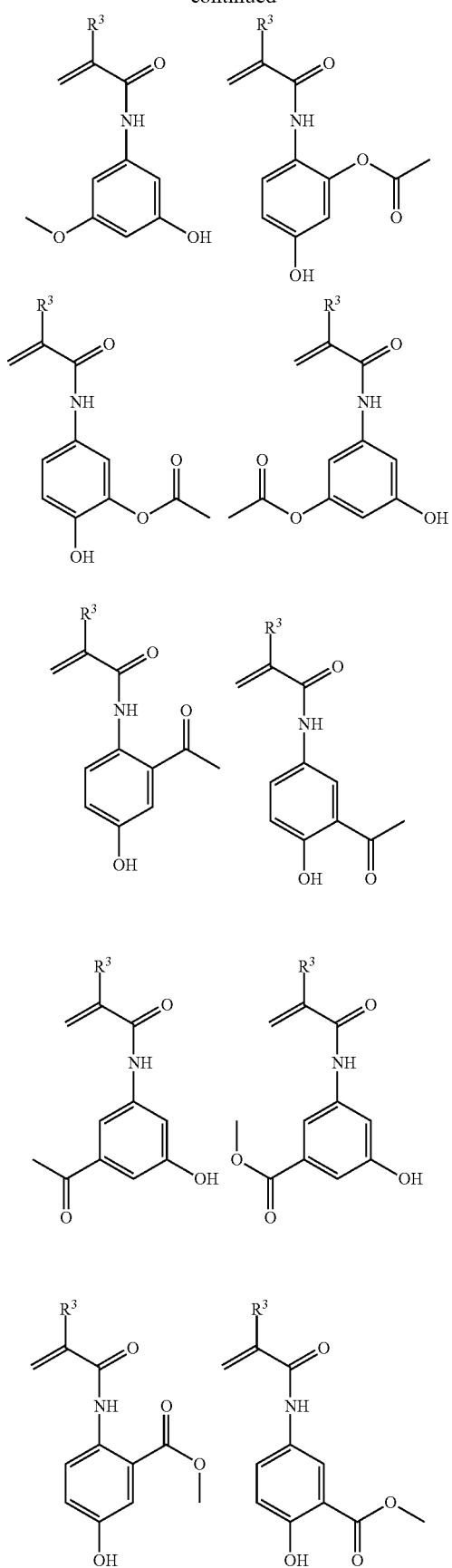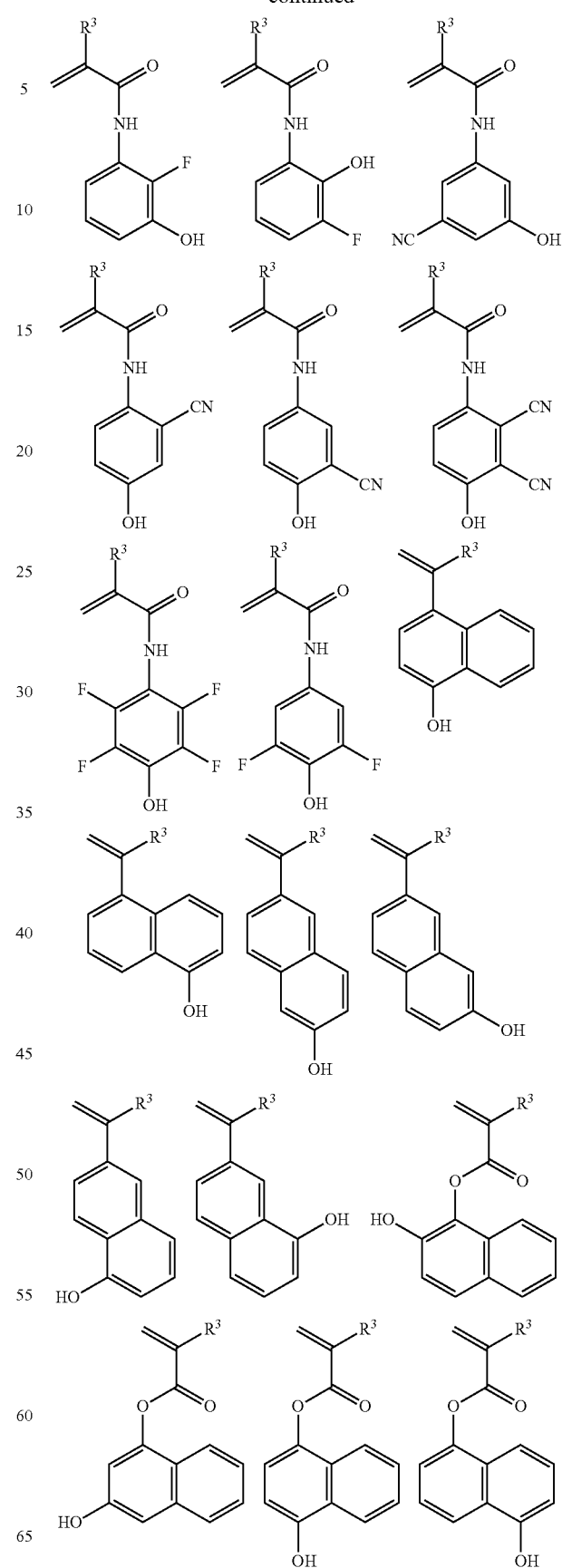

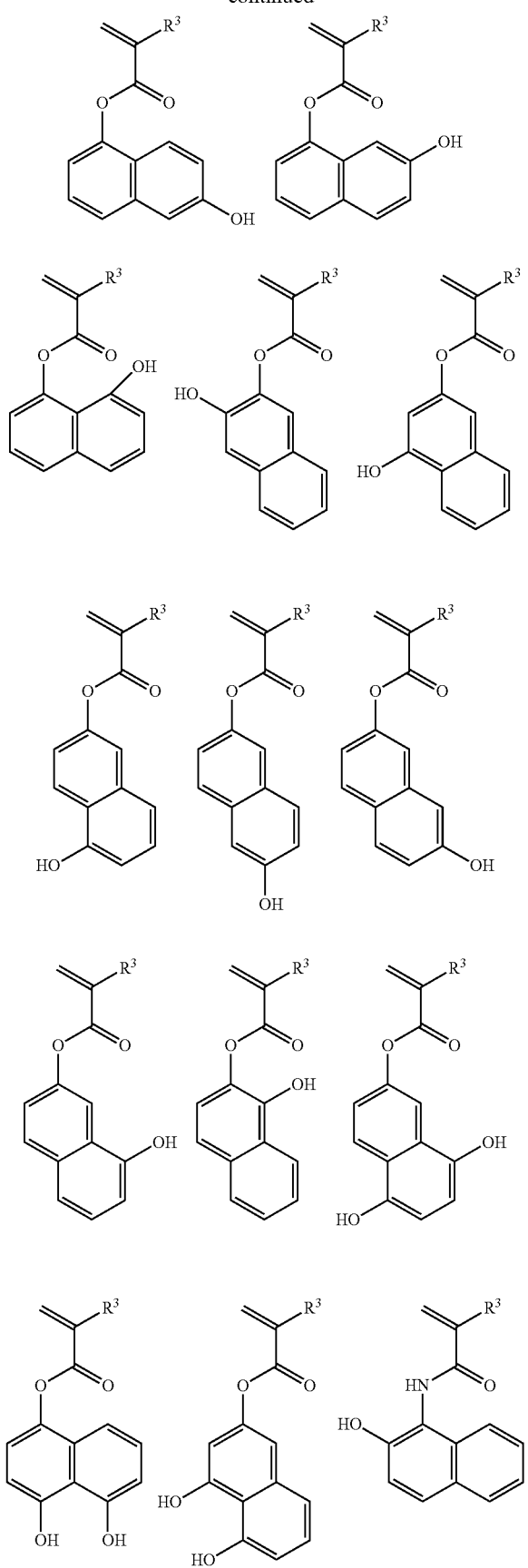

-continued
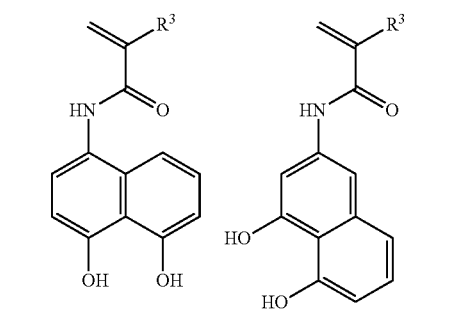
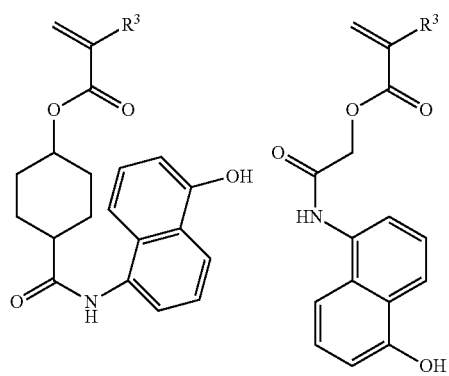
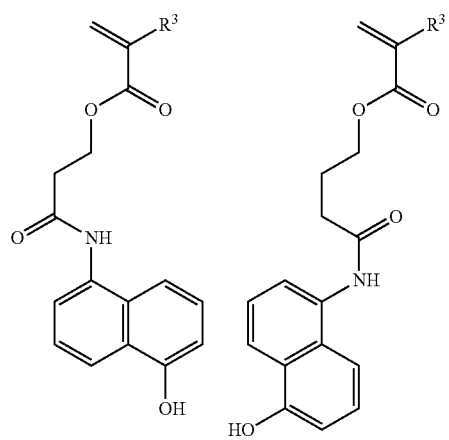
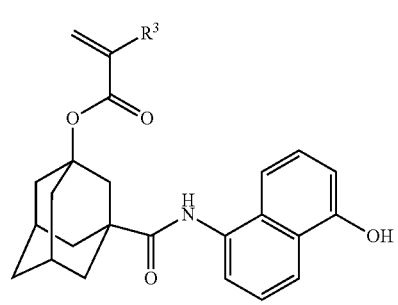
-continued
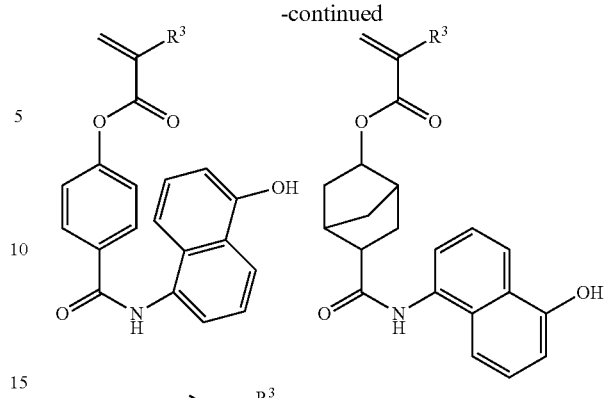
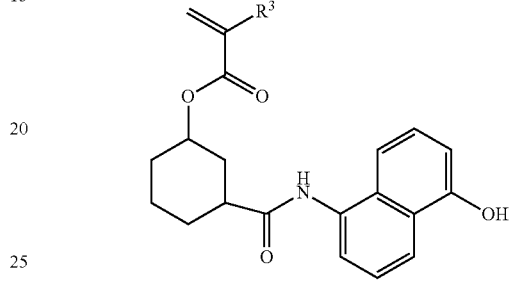
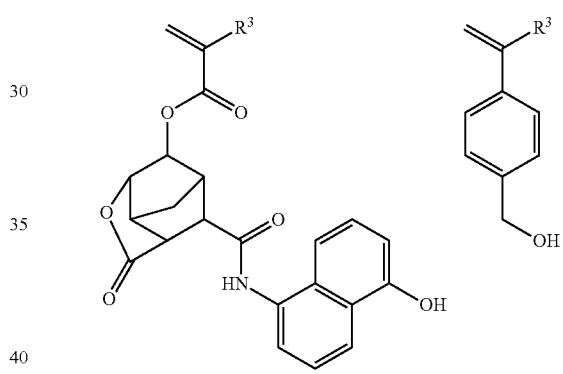
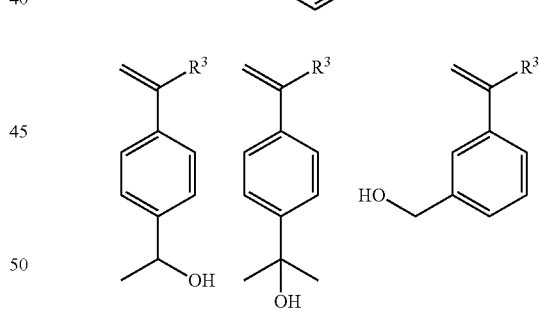
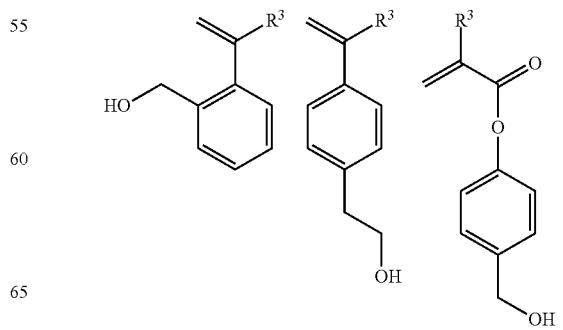

-continued

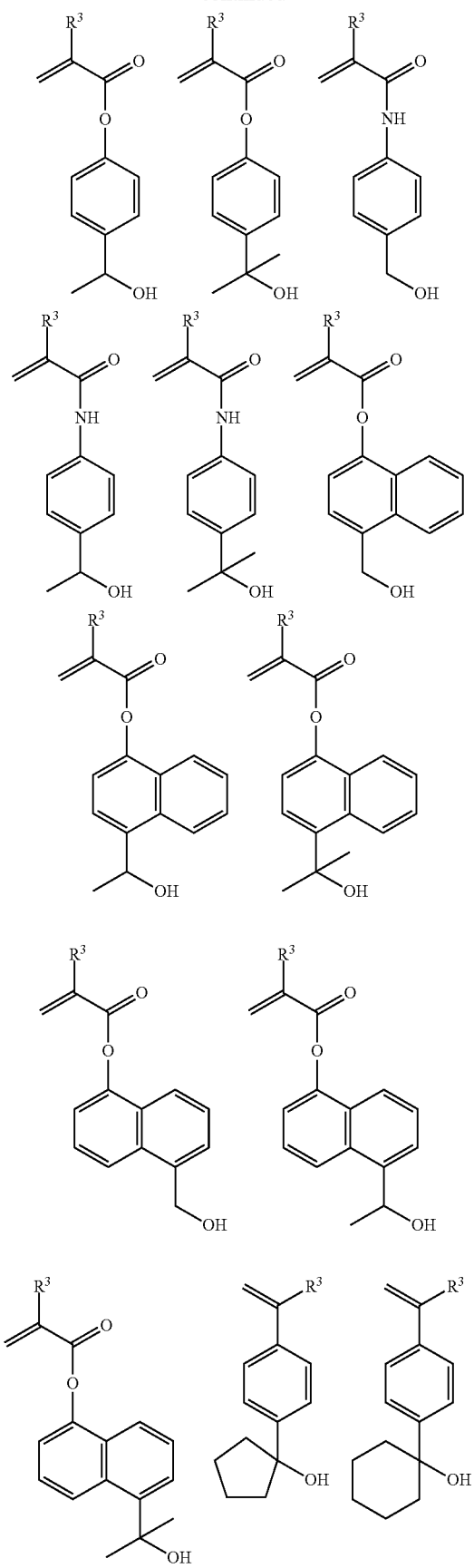

-continued

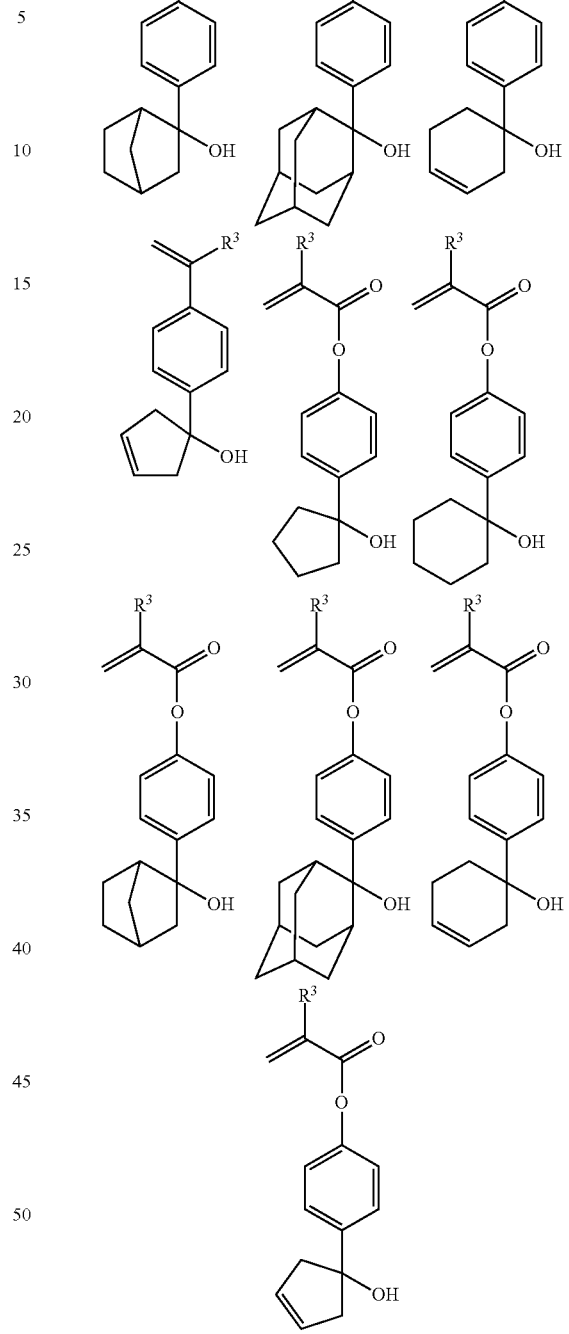

For the polymer, recurring units (a) of styrene having an ester group bonded to an HFA group and recurring units (b) having a hydroxyl group, represented by formula (1), are essential while other recurring units (c) may be copolymerized therein. Suitable recurring units (c) include units derived from monomers such as indene, hydroxyindene, styrene, vinylnaphthalene, vinylanthracene, vinylpyrene, indole, acenaphthylene, norbornadiene, norbornene, tricyclodecene, tetracyclododecene, methyleneindane, chromone, coumaron, lactone-containing (meth)acrylates, (meth)acrylic acid, 3-hydroxyadamantane (meth)acrylate, maleic anhydride, itaconic anhydride, maleimides, vinyl ethers, α-hydroxymethylacrylates, styrenecarboxylic acid, and α-trifluoromethyl alcohol-bearing monomers.

Of these, for example, the recurring units having α-trifluoromethyl alcohol have the general formula (2).

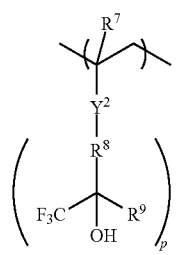

(2)

Herein $R^7$ is hydrogen or methyl; $Y^2$ is a single bond, benzene ring, —O—, —C(=O)—O— or —C(=O)—O—$R^{10}$—C(=O)—O— wherein $R^{10}$ is a straight, branched or cyclic $C_1$-$C_{10}$ alkylene group which may be fluorinated or have trifluoromethyl radical; $R^8$ is a single bond or a straight, branched or cyclic $C_1$-$C_{10}$ alkylene group which may be fluorinated or have hydroxyl radical; $R^9$ is hydrogen, fluorine, methyl, trifluoromethyl or difluoromethyl, or $R^9$ may bond with $R^8$ to form a ring which may have an ether, fluorinated alkylene or trifluoromethyl radical; p is 1 or 2.

Examples of the monomer from which the α-trifluoromethyl alcohol-containing recurring units of formula (2) are derived are shown below wherein $R^7$ is as defined above.

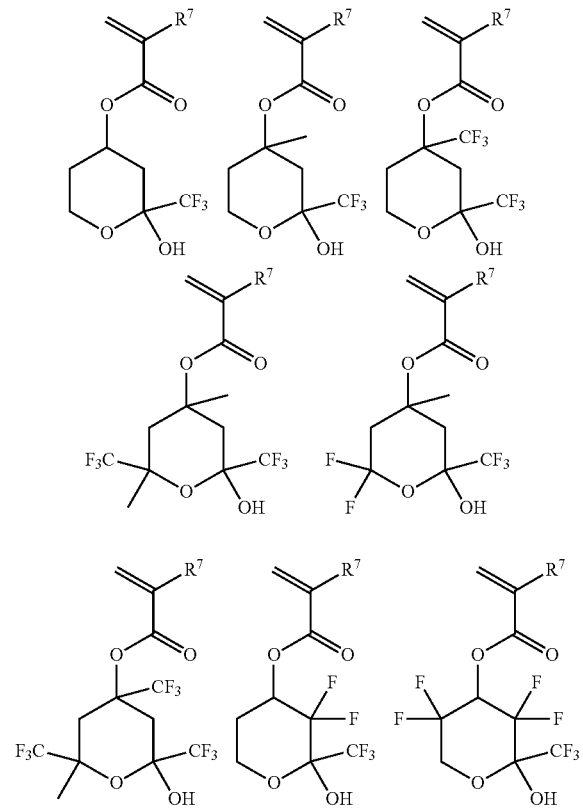

-continued

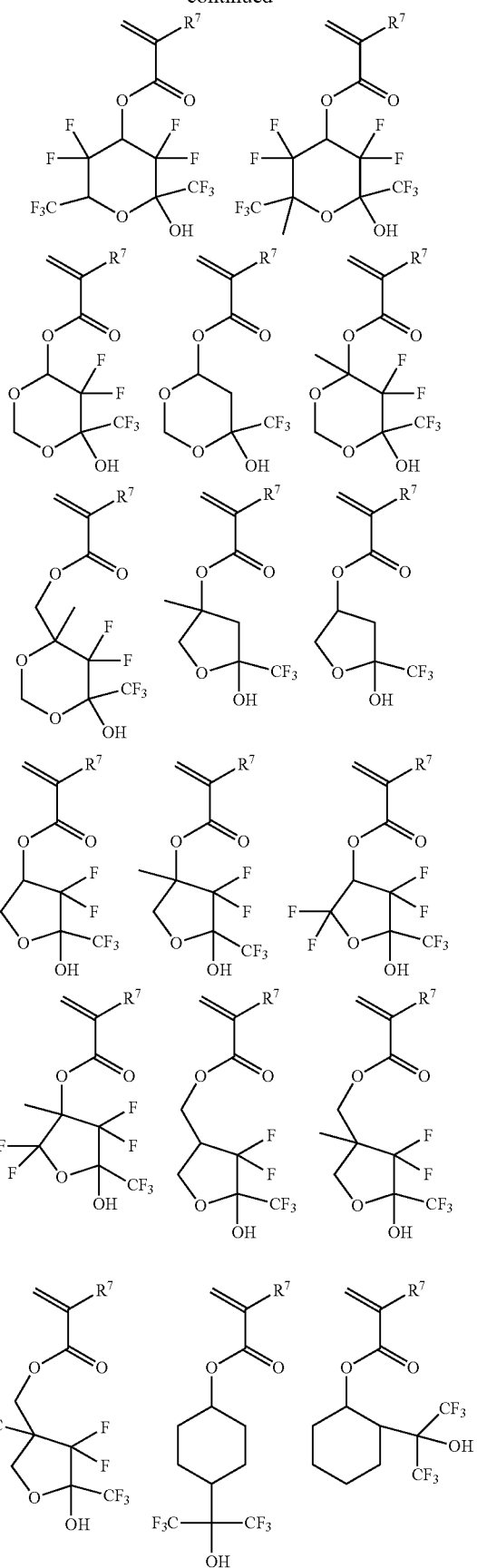

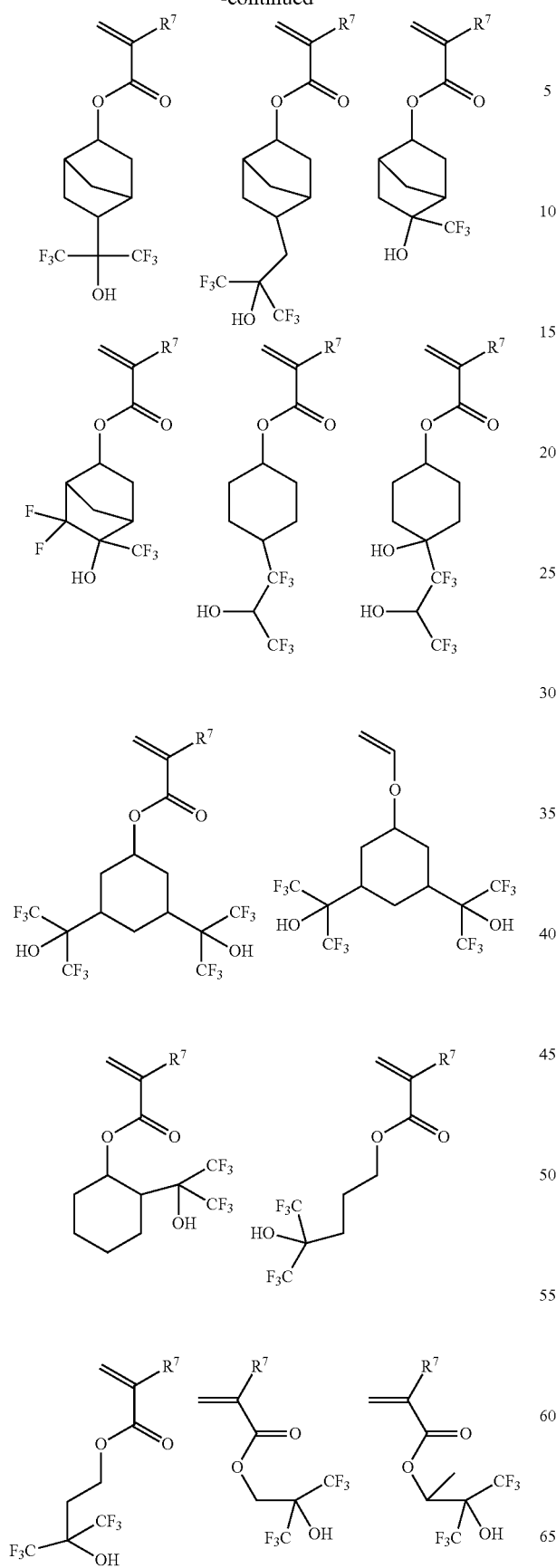
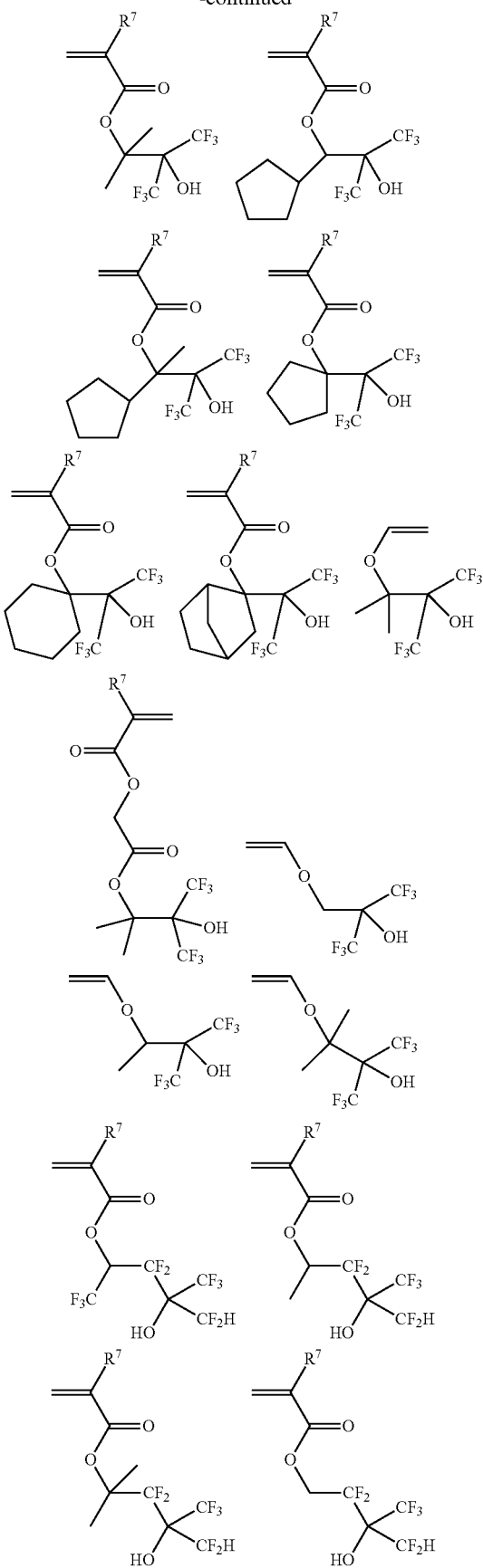

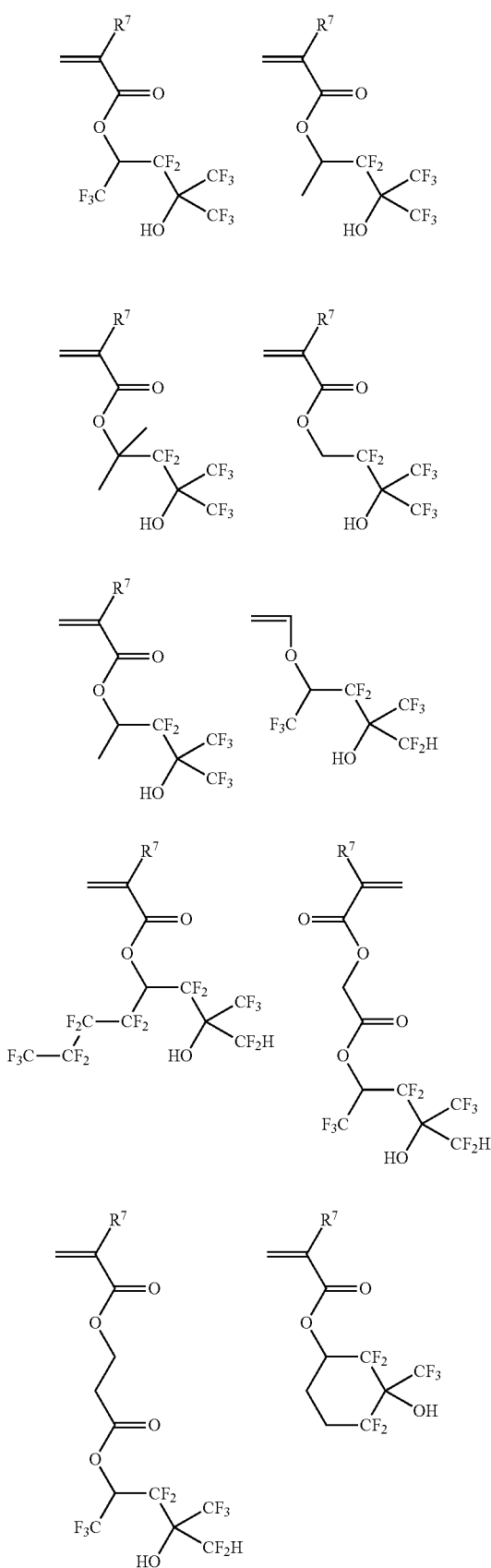

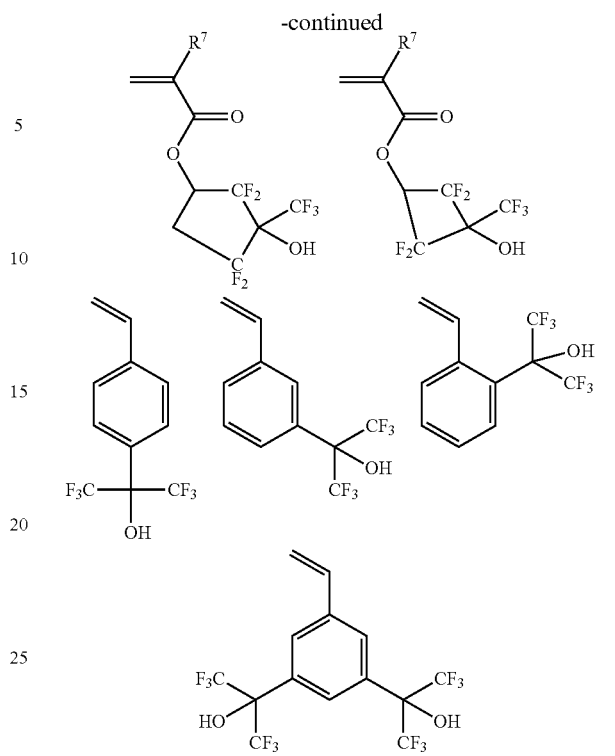

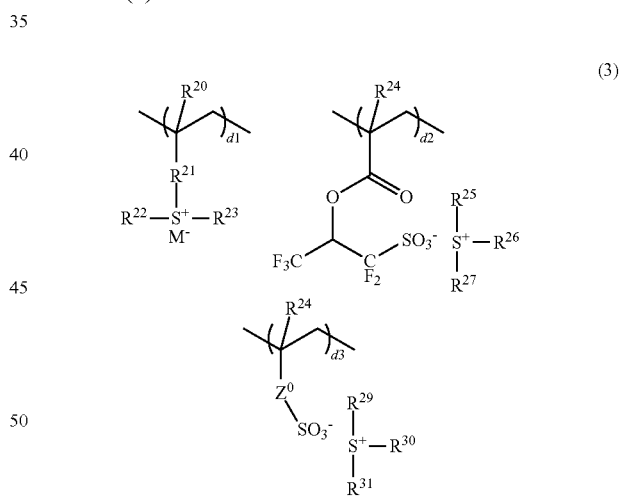

The polymer may have further copolymerized therein recurring units of at least one type selected from sulfonium salt-containing units (d1) to (d3) represented by the general formula (3).

Herein $R^{20}$, $R^{24}$, and $R^{28}$ each are hydrogen or methyl. $R^{21}$ is a single bond, phenylene, —O—R—, or —C(=O)—$Y^0$—R—, wherein $Y^0$ is oxygen or NH, and R is a straight, branched or cyclic $C_1$-$C_6$ alkylene group, alkenylene or phenylene group, which may contain a carbonyl (—CO—), ester (—COO—), ether (—O—) or hydroxyl radical. $R^{22}$, $R^{23}$, $R^{25}$, $R^{26}$, $R^{27}$, $R^{29}$, $R^{30}$, and $R^{31}$ are each independently a straight, branched or cyclic $C_1$-$C_{12}$ alkyl group which may contain a carbonyl, ester or ether radical, or a $C_6$-$C_{12}$ aryl, $C_7$-$C_{20}$ aralkyl, or thiophenyl group. $Z^0$ is a single bond, methylene, ethylene, phenylene, fluorophenylene, —O—$R^{32}$—, or —C(=O)—$Z^1$—$R^{32}$—, wherein $Z^1$ is oxygen or NH, and $R^{32}$ is a straight, branched or cyclic $C_1$-$C_6$ alkylene group, alkenylene or phenylene group, which may contain a carbonyl, ester, ether or hydroxyl radical. M⁻ is a non-nucleophilic counter ion, d1, d2 and d3 are in the range of $0 \leq d1 \leq 0.4$, $0 \leq d2 \leq 0.4$, $0 \leq d3 \leq 0.4$, and $0 < d1+d2+d3 \leq 0.4$.

Examples of the non-nucleophilic counter ion represented by M⁻ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imidates such as bis(trifluoromethylsulfonyl)imide, bis(perfluoroethylsulfonyl)imide and bis(perfluorobutylsulfonyl)imide; and methidates such as tris(trifluoromethylsulfonyl)methide and tris(perfluoroethylsulfonyl)methide.

The attachment of an acid generator to the polymer main chain is effective in restraining acid diffusion, thereby preventing a reduction of resolution due to blur by acid diffusion. Also edge roughness (LER or LWR) is improved since the acid generator is uniformly dispersed.

The polymer used herein may be synthesized by any desired methods, for example, by dissolving suitable monomers corresponding to the recurring units (a) to (d) in an organic solvent, adding a radical polymerization initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours.

With respect to the hydroxyl-containing recurring unit (b) in formula (1), the hydroxyl group may be substituted by an acetoxy group in the monomer stage, and after polymerization, alkaline hydrolysis be carried out for converting the acetoxy group back to a hydroxyl group. For alkaline hydrolysis, a base such as aqueous ammonia or triethylamine may be used. The reaction temperature is −20° C. to 100° C., preferably 0° C. to 60° C., and the reaction time is 0.2 to 100 hours, preferably 0.5 to 20 hours.

Also, for the purpose of adjusting the alkaline dissolution rate of the polymer (hydroxypolyvinylnaphthalene or hydroxyvinylnaphthalene copolymer), the hydrogen of hydroxyl group on hydroxyvinylnaphthalene may be substituted by an acetyl or alkyl group. A degree of substitution is preferably more than 1% to 40% of hydroxyl groups. In one exemplary substitution method, the polymer is reacted with acetyl chloride or a halogenated alkyl compound in the presence of a base, yielding a polymer in which the hydrogen of (phenolic) hydroxyl group on hydroxyvinylnaphthalene is partially protected with an acetyl or alkyl group.

In the copolymer, recurring units (a), (b), (c), (d1), (d2) and (d3) may be incorporated in the following molar fraction:
$0 < a < 1.0$, $0 < b < 1.0$, $0 \leq c \leq 0.9$, $0 \leq d1 \leq 0.4$, $0 \leq d2 \leq 0.4$, $0 \leq d3 \leq 0.4$, $0 \leq d1+d2+d3 \leq 0.4$;
preferably $0.05 \leq a \leq 0.9$, $0.1 \leq b \leq 0.9$, $0 \leq c \leq 0.8$, $0 \leq d1 \leq 0.3$, $0 \leq d2 \leq 0.3$, $0 \leq d3 \leq 0.3$, $0 \leq d1+d2+d3 \leq 0.3$;
more preferably $0.1 \leq a \leq 0.8$, $0.15 \leq b \leq 0.8$, $0 \leq c \leq 0.7$, $0 \leq d1 \leq 0.2$, $0 \leq d2 \leq 0.2$, $0 \leq d3 \leq 0.2$, $0 \leq d1+d2+d3 \leq 0.2$,
and $a+b+c+d1+d2+d3=1.0$.

The polymer should preferably have a weight average molecular weight (Mw) in the range of 1,000 to 500,000, and more preferably 2,000 to 30,000, as measured by GPC versus polystyrene standards. With a Mw of 1,000 or higher, the resist composition may be fully heat resistant. A polymer with a Mw of up to 500,000 may have alkaline solubility and may not give rise to an undercut phenomenon after pattern formation.

The polymer should preferably have a narrow dispersity (Mw/Mn) of 1.0 to 2.0, especially 1.0 to 1.5. With such narrow dispersity, there is little possibility that foreign matter is left on the pattern or the pattern profile is degraded because of the presence of lower and higher molecular weight polymer fractions. The influences of molecular weight and dispersity become stronger as the pattern rule becomes finer. The polymer should preferably have a narrow dispersity in order to provide a resist composition suitable for micropatterning to a small feature size.

It is understood that a blend of two or more polymers which differ in compositional ratio, molecular weight or dispersity is acceptable.

The polymer is advantageously used as a base resin in a negative resist composition, typically chemically amplified negative resist composition. Specifically, the polymer is used as a base resin and combined with any desired components including an organic solvent, acid generator, crosslinker, dissolution regulator, basic compound, and surfactant to formulate a negative resist composition.

This negative resist composition has a very high sensitivity in that the dissolution rate in developer of the polymer in exposed areas is reduced by catalytic reaction. In addition, the resist film has a high dissolution contrast, resolution, exposure latitude, and process adaptability, and provides a good pattern profile after exposure, yet better etch resistance, and minimal proximity bias because of restrained acid diffusion. By virtue of these advantages, the composition is fully useful in commercial application and suited as a pattern-forming material for the fabrication of VLSIs.

Particularly when an acid generator is incorporated to formulate a chemically amplified negative resist composition capable of utilizing acid catalyzed reaction, the composition has a higher sensitivity and is further improved in the properties described above.

Addition of a basic compound may be effective in suppressing the diffusion rate of acid in the resist film, achieving a further improvement in resolution. Addition of a surfactant may improve or control the coating characteristics of the resist composition.

The negative resist composition may include an acid generator in order for the composition to function as a chemically amplified negative resist composition. Typical of the acid generator used herein is a photoacid generator (PAG) capable of generating an acid in response to actinic light or radiation. It is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The acid generators may be used alone or in admixture of two or more. Exemplary acid generators are described in JP-A 2008-111103, paragraphs [0122] to [0142] (U.S. Pat. No. 7,537,880). In the embodiment wherein a polymer having recurring units (d1), (d2) or (d3) copolymerized therein is used as the base resin, the PAG may be omitted.

To the resist composition, a sulfonium or iodonium salt capable of generating a weak acid not to evoke crosslinking reaction may be added instead of the basic compound. In a system comprising an acid generator capable of generating a strong acid enough to evoke crosslinking reaction, the acid generated by the acid generator is trapped via ion exchange with the sulfonium or iodonium salt of weak acid. This means that the sulfonium or iodonium salt of weak acid generation type functions as a quencher.

Examples of the organic solvent used herein are described in JP-A 2008-111103, paragraphs [0144] to [0145] (U.S. Pat. No. 7,537,880). Specifically, exemplary solvents include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, and mixtures thereof.

The basic compound is preferably a compound capable of holding down the diffusion rate of acid when the acid generated by the acid generator diffuses in the resist film. The inclusion of the basic compound holds down the diffusion rate of acid in the resist film, which leads to many advantages including improved resolution, minimized sensitivity change following exposure, reduced substrate poisoning and environment dependency, and improved exposure latitude and pattern profile. Exemplary basic compounds are described in JP-A 2008-111103, paragraphs [0146] to [0164], for example, primary, secondary and tertiary amine compounds, specifically amine compounds having a hydroxyl, ether, ester, lactone, cyano or sulfonate group. Also useful are compounds having a carbamate group, as described in JP 3790649.

Exemplary surfactants are described in JP-A 2008-111103, paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182]. Also useful are quenchers of polymer type as described in JP-A 2008-239918. The polymeric quencher segregates at the resist surface after coating and thus enhances the rectangularity of resist pattern. When a protective film is applied as is often the case in the immersion lithography, the polymeric quencher is also effective for preventing any film thickness loss of resist pattern or rounding of pattern top.

An appropriate amount of the acid generator used is 0.01 to 100 parts, and preferably 0.1 to 80 parts. An appropriate amount of the organic solvent used is 50 to 10,000 parts, especially 100 to 5,000 parts. The dissolution regulator may be blended in an amount of 0 to 50 parts, preferably 0 to 40 parts, the basic compound in an amount of 0 to 100 parts, preferably 0.001 to 50 parts, and the surfactant in an amount of 0 to 10 parts, preferably 0.0001 to 5 parts. All amounts are expressed in parts by weight relative to 100 parts by weight of the base resin.

To the negative resist composition, a crosslinker may be added. Suitable crosslinkers which can be used herein include melamine compounds, guanamine compounds, glycoluril compounds and urea compounds having substituted thereon at least one group selected from among methylol, alkoxymethyl and acyloxymethyl groups, epoxy compounds, isocyanate compounds, azide compounds, and compounds having a double bond such as an alkenyl ether group. These compounds may be used as an additive or introduced into a polymer side chain as a pendant. Hydroxy-containing compounds may also be used as the crosslinker.

Of the foregoing crosslinkers, examples of suitable epoxy compounds include tris(2,3-epoxypropyl) isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Suitable isocyanate compounds include tolylene diisocyanate, diphenylmethane diisocyanate, hexamethylene diisocyanate and cyclohexane diisocyanate. Suitable azide compounds include 1,1'-biphenyl-4,4'-bisazide, 4,4'-methylidenebisazide, and 4,4'-oxybisazide. Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

The crosslinker may be blended in an amount of 0 to 50 parts, preferably 5 to 50 parts, and more preferably 10 to 30 parts by weight per 100 parts by weight of the base resin. At least 5 parts of the crosslinker achieves a sufficient improvement in resolution. As long as the amount of the crosslinker is not more than 50 parts, there is a minimized risk that resolution is reduced as a result of pattern features merging together. The crosslinkers may be used alone or in admixture.

Process

The negative resist composition, typically chemically amplified negative resist composition comprising a polymer comprising units (a) and (b) of formula (1) is used in the fabrication of various integrated circuits. Pattern formation using the resist composition may be performed by well-known lithography processes. The process generally involves coating of the negative resist composition on a substrate, prebake, exposure to high-energy radiation, and development in a developer for thereby forming a pattern on a semiconductor or mask substrate. If necessary, any additional steps may be added.

For instance, the negative resist composition is applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON or MoSi) by a suitable coating technique such as spin coating, roll coating, flow coating, dip coating, spray coating or doctor coating. The coating is prebaked on a hot plate at a temperature of 60 to 150° C. for 10 seconds to 30 minutes, preferably 80 to 120° C. for 30 seconds to 20 minutes. The resulting resist film is generally 0.1 to 2.0 μm thick.

The resist film is then exposed to a desired pattern of high-energy radiation such as UV, deep-UV, EB, x-ray, excimer laser light, γ-ray, synchrotron radiation or EUV (soft x-ray), directly or through a mask. The exposure dose is preferably about 1 to 200 mJ/cm$^2$, more preferably about 10 to 100 mJ/cm$^2$, or 0.1 to 100 μC/cm$^2$, more preferably 0.5 to 50 μC/cm$^2$. The resist film is further baked (PEB) on a hot plate at 60 to 150° C. for 10 seconds to 30 minutes, preferably 80 to 120° C. for 30 seconds to 20 minutes.

Thereafter the resist film is developed in a developer in the form of an aqueous alkaline solution, typically a 0.1 to 5 wt %, preferably 2 to 3 wt % aqueous solution of tetramethylammonium hydroxide (TMAH), for 3 seconds to 3 minutes, preferably 5 seconds to 2 minutes by conventional techniques such as dip, puddle or spray techniques. The resist film in the exposed region is insolubilized whereas the resist film in the unexposed region is dissolved in the developer. In this way, the desired negative pattern is formed on the substrate. It is appreciated that the resist composition of the invention is best suited for micro-patterning using such high-energy radiation as EB, EUV (soft x-ray), x-ray, γ-ray and synchrotron radiation among others.

EXAMPLE

Synthesis Examples, Comparative Synthesis Examples, Examples and Comparative Examples are given below for further illustrating the invention, but they should not be construed as limiting the invention thereto. Mw is measured by GPC versus polystyrene standards. All parts (pbw) are by weight.

Synthesis Example 1

A 2-L flask was charged with 6.5 g of Monomer 1, 9.7 g of acetoxystyrene, 3 g of acenaphthylene, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of azobisisobutyronitrile (AIBN) was added as polymerization initiator. The reactor was heated at 60° C. and reaction run for 15 hours. The reaction solution was precipitated from 1 L of isopropyl alcohol. The white solid was dissolved again in a mixture of 100 mL of methanol and 200 mL of tetrahydrofuran, to which 10 g of triethylamine and 10 g of water were added. Deprotection reaction of acetyl group was conducted at 70° C. for 5 hours, followed by neutralization with acetic acid. The reaction solution was concentrated and dissolved in 100 mL of acetone. By similar precipitation, filtration, and drying at 60° C., a white polymer was obtained.

The polymer was analyzed by $^{13}$C-NMR, $^1$H-NMR, and GPC, with the analytical data shown below.
Copolymer composition (molar ratio)
  Monomer 1:4-hydroxystyrene:acenaphthylene=0.20:0.60:0.20
Mw=4,600
Mw/Mn=1.66

This is designated Polymer 1.

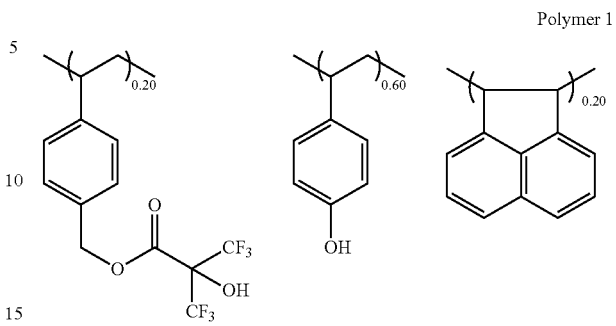

Polymer 1

Synthesis Example 2

A 2-L flask was charged with 6.5 g of Monomer 1, 6.5 g of Monomer 3, 6.5 g of acetoxystyrene, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as polymerization initiator. The reactor was heated at 60° C. and reaction run for 15 hours. The reaction solution was precipitated from 1 L of isopropyl alcohol. The white solid was dissolved again in a mixture of 100 mL of methanol and 200 mL of tetrahydrofuran, to which 10 g of triethylamine and 10 g of water were added. Deprotection reaction of acetyl group was conducted at 70° C. for 5 hours, followed by neutralization with acetic acid. The reaction solution was concentrated and dissolved in 100 mL of acetone. By similar precipitation, filtration, and drying at 60° C., a white polymer was obtained.

The polymer was analyzed by $^{13}$C-NMR, $^1$H-NMR, and GPC, with the analytical data shown below.
Copolymer composition (molar ratio)
  Monomer 1:Monomer 3:4-hydroxystyrene=0.20:0.40:0.40
Mw=7,100
Mw/Mn=1.66

This is designated Polymer 2.

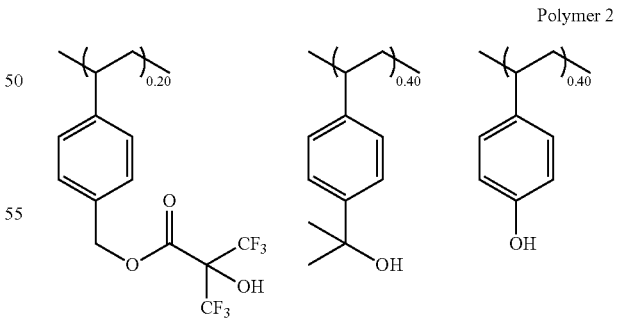

Polymer 2

Synthesis Example 3

A 2-L flask was charged with 6.5 g of Monomer 1, 9.4 g of Monomer 4, 8.1 g of 4-(1,1,1,3,3,3-hexafluoro-2-hydroxypropyl)styrene, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as polymerization initiator. The reactor was heated at 60° C. and reaction run for 15 hours. The reaction solution was precipitated from 1 L of isopropyl alcohol. The precipitate was filtered and dried at 60° C., obtaining a white polymer.

The polymer was analyzed by $^{13}$C-NMR, $^{1}$H-NMR, and GPC, with the analytical data shown below.

Copolymer composition (molar ratio)

Monomer 1:Monomer 4:4-(1,1,1,3,3,3-hexafluoro-2-hydroxypropyl)styrene=0.20:0.50:0.30

Mw=6,800

Mw/Mn=1.71

This is designated Polymer 3.

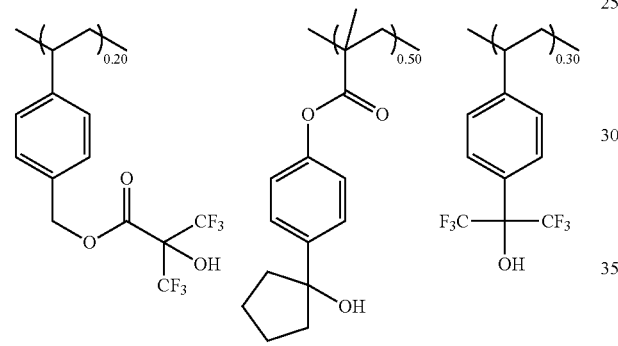

Polymer 3

Synthesis Example 4

A 2-L flask was charged with 6.5 g of Monomer 1, 8.9 g of 4-hydroxyphenyl methacrylate, 3.1 g of 2-vinylnaphthalene, 5.6 g of PAG Monomer 1, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as polymerization initiator. The reactor was heated at 60° C. and reaction run for 15 hours. The reaction solution was precipitated from 1 L of isopropyl alcohol. The precipitate was filtered and dried at 60° C., obtaining a white polymer.

The polymer was analyzed by $^{13}$C-NMR, $^{1}$H-NMR, and GPC, with the analytical data shown below.

Copolymer composition (molar ratio)

Monomer 1:4-hydroxyphenyl methacrylate:2-vinyl-naphthalene:PAG Monomer 1=0.20:0.50:0.20:0.10

Mw=7,700

Mw/Mn=1.78

This is designated Polymer 4.

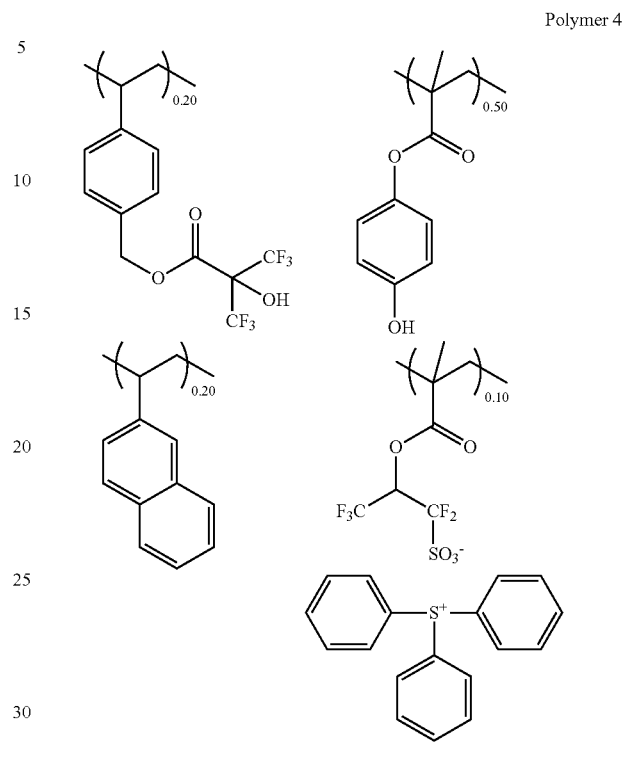

Polymer 4

PAG Monomer 1: triphenylsulfonium 1,1,1,3,3,3-pentafluoro-2-methacryloyloxypropane-1-sulfonate

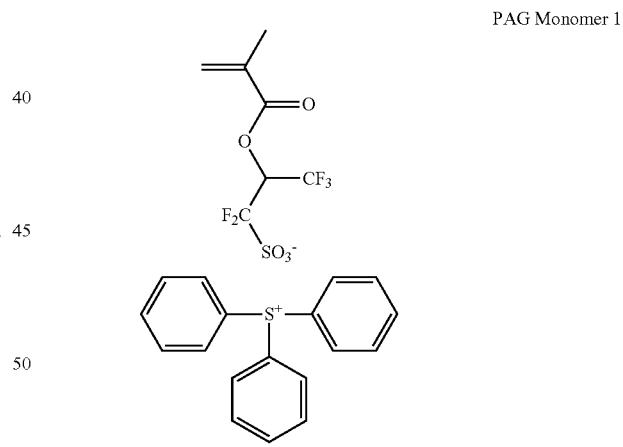

PAG Monomer 1

Synthesis Example 5

A 2-L flask was charged with 6.5 g of Monomer 2, 7.8 g of Monomer 5, 5.3 g of 4-hydroxyphenyl methacrylate, 2.9 g of coumarin, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as polymerization initiator. The reactor was heated at 60° C. and reaction run for 15 hours. The reaction solution was precipitated from 1 L of isopropyl alcohol. The precipitate was filtered and dried at 60° C., obtaining a white polymer.

The polymer was analyzed by $^{13}$C-NMR, $^1$H-NMR, and GPC, with the analytical data shown below.

Copolymer composition (molar ratio)
  Monomer 2:Monomer 5:4-hydroxyphenyl methacrylate: coumarin=0.20:0.30:0.30:0.20

Mw=6,300

Mw/Mn=1.79

This is designated Polymer 5.

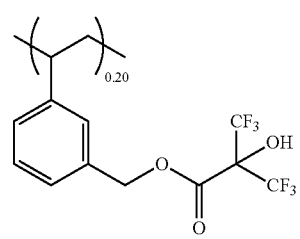
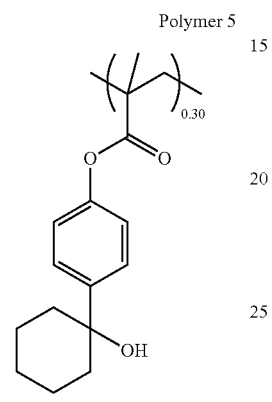
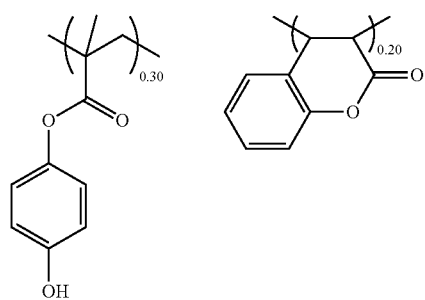

Polymer 5

Synthesis Example 6

A 2-L flask was charged with 6.5 g of Monomer 2, 7.8 g of Monomer 5, 5.3 g of 4-hydroxyphenyl methacrylate, 2.3 g of indene, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as polymerization initiator. The reactor was heated at 60° C. and reaction run for 15 hours. The reaction solution was precipitated from 1 L of isopropyl alcohol. The precipitate was filtered and dried at 60° C., obtaining a white polymer.

The polymer was analyzed by $^{13}$C-NMR, $^1$H-NMR, and GPC, with the analytical data shown below.

Copolymer composition (molar ratio)
  Monomer 2:Monomer 5:4-hydroxyphenyl methacrylate: indene=0.20:0.30:0.30:0.20

Mw=5,900

Mw/Mn=1.59

This is designated Polymer 6.

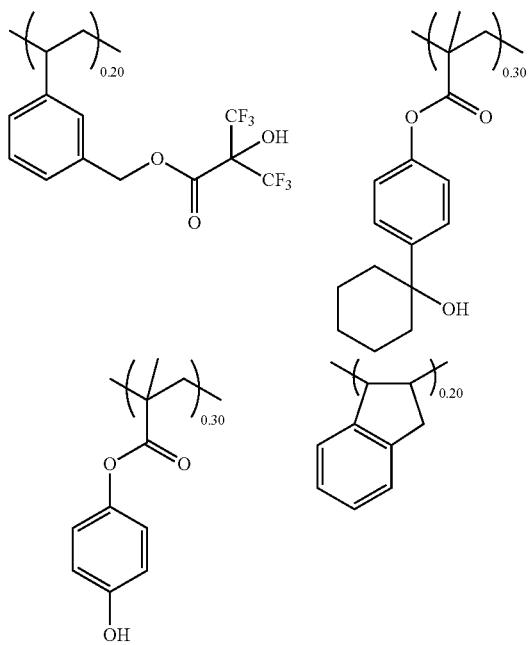

Polymer 6

Synthesis Example 7

A 2-L flask was charged with 6.5 g of Monomer 1, 7.6 g of Monomer 6, 5.3 g of 4-hydroxyphenyl methacrylate, 3.0 g of acenaphthylene, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as polymerization initiator. The reactor was heated at 60° C. and reaction run for 15 hours. The reaction solution was precipitated from 1 L of isopropyl alcohol. The precipitate was filtered and dried at 60° C., obtaining a white polymer.

The polymer was analyzed by $^{13}$C-NMR, $^1$H-NMR, and GPC, with the analytical data shown below.

Copolymer composition (molar ratio)
  Monomer 1:Monomer 6:4-hydroxyphenyl methacrylate: acenaphthylene=0.20:0.30:0.30:0.20

Mw=6,700

Mw/Mn=1.71

This is designated Polymer 7.

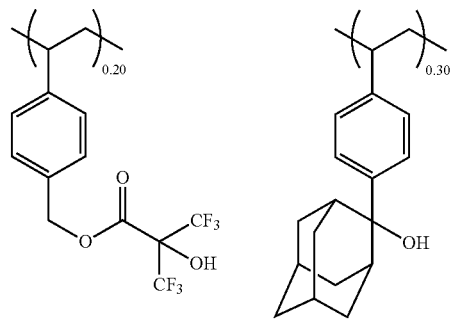

Polymer 7

-continued

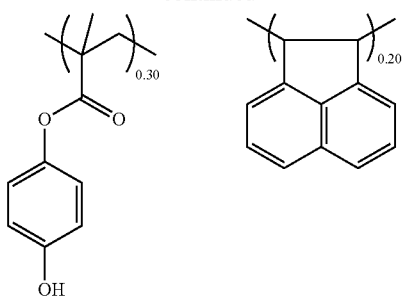

Comparative Synthesis Example 1

A comparative (binary) polymer was synthesized by the same procedure as above. It was analyzed by $^{13}C$-, $^{1}H$-NMR, and GPC, with the analytical data shown below.

Copolymer composition (molar ratio)
  hydroxystyrene:styrene=0.70:0.30
Mw=4,500
Mw/Mn=1.55

This is designated Comparative Polymer 1.

Comparative Polymer 1

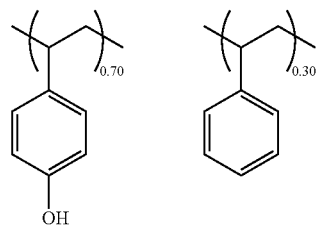

Comparative Synthesis Example 2

A comparative (binary) polymer was synthesized by the same procedure as above.

Copolymer composition (molar ratio)
  hydroxystyrene:1-vinylnaphthalene=0.80:0.20
Mw=5,900
Mw/Mn=1.51

This is designated Comparative Polymer 2.

Comparative Polymer 2

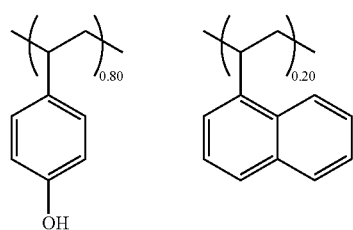

Comparative Synthesis Example 3

A comparative polymer was synthesized by the same procedure as above.

Copolymer composition (molar ratio)
  Monomer 5:4-hydroxyphenyl methacrylate:indene=0.30:0.50:0.20
Mw=5,400
Mw/Mn=1.69

This is designated Comparative Polymer 3.

Comparative Polymer 3

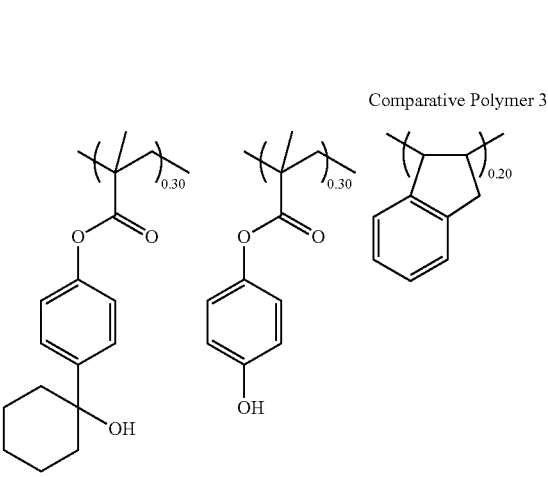

Comparative Synthesis Example 4

A comparative polymer was synthesized by the same procedure as above.

Copolymer composition (molar ratio)
  4-(1,1,1,3,3,3-hexafluoro-2-hydroxypropyl)styrene:
  Monomer 6:4-hydroxyphenyl methacrylate:acenaphthylene=0.20:0.30:0.30:0.20
Mw=6,900
Mw/Mn=1.78

This is designated Comparative Polymer 4.

Comparative Polymer 4

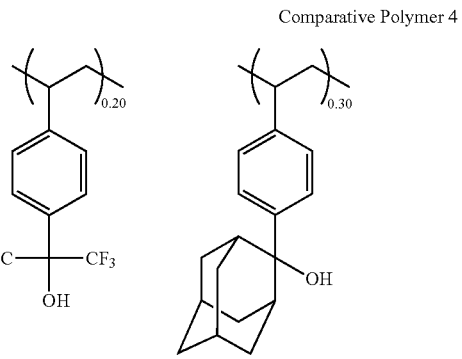

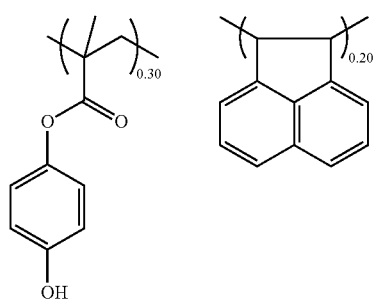

Comparative Synthesis Example 5

A comparative polymer was synthesized by the same procedure as above.

Copolymer composition (molar ratio)

4-styrenecarboxylic acid:Monomer 6:4-hydroxyphenyl methacrylate:acenaphthylene=0.20:0.30:0.30:0.20

Mw=7,400

Mw/Mn=1.71

This is designated Comparative Polymer 5.

Comparative Polymer 5

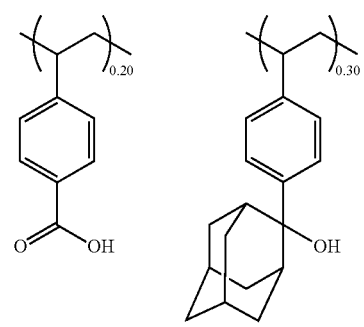

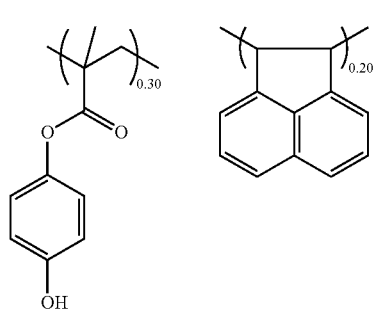

Monomers 1 to 6 used herein are identified below.

Monomer 1

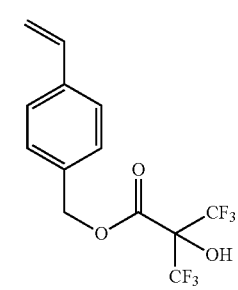

Monomer 2

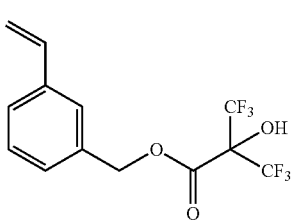

Monomer 3

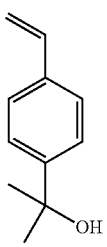

Monomer 4

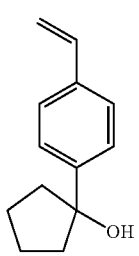

Monomer 5

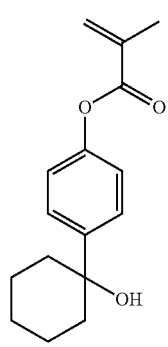

Monomer 6

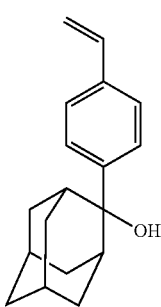

Examples and Comparative Examples

Preparation of Negative Resist Composition

Resist compositions in solution form were prepared by dissolving each polymer synthesized above, an acid generator, basic compound and crosslinker in an organic solvent in accordance with the recipe shown in Table 1, and filtering through a filter having a pore size of 0.2 μm.

The components in Table 1 are as identified below.

Polymers 1 to 7: polymers synthesized in Synthesis Examples 1 to 7

Comparative Polymers 1 to 5: polymers synthesized in Comparative Synthesis Examples 1 to 5

Acid generator: PAG1 of the following structural formula

PAG 1

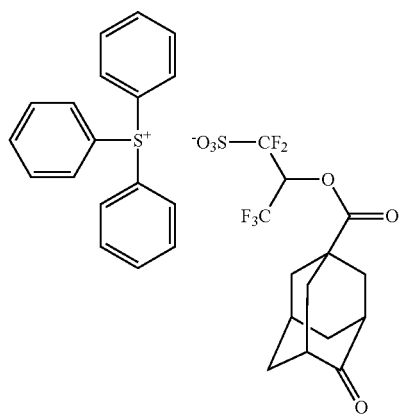

Basic compounds: Amine 1 and Quencher 1 of the following structural formulae

Amine 1

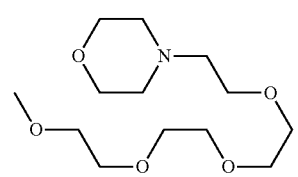

Quencher 1

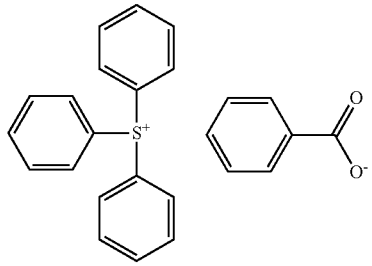

Crosslinker: CR1 of the following structural formula

CR 1

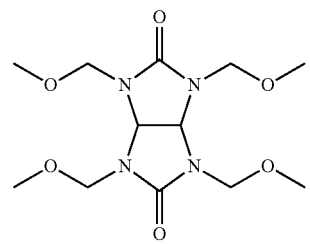

Organic solvents: propylene glycol methyl ether acetate (PGMEA)

cyclohexanone (CyH)

cyclopentanone (CyP)

EB Writing Test

Using a coater/developer system Clean Track Mark 5 (Tokyo Electron Ltd.), the negative resist composition prepared above was spin coated onto a silicon substrate (diameter 6 inches=200 mm) and pre-baked on a hot plate at 110° C. for 90 seconds to form a resist film of 100 nm thick. Using a system HL-800D (Hitachi Ltd.) at a HV voltage of 50 keV, the resist film was exposed imagewise to EB in a vacuum chamber.

Using Clean Track Mark 5, immediately after the imagewise exposure, the wafer was baked (PEB) on a hot plate at the temperature shown in Table 1 for 90 seconds and puddle developed in a 2.38 wt % TMAH aqueous solution for 30 seconds to form a negative pattern.

Sensitivity is the exposure dose (μC/cm$^2$) that provides a 1:1 resolution of a 120-nm line-and-space pattern. Resolution is a minimum size at the optimum dose. The 120-nm line-and-space pattern was measured for edge roughness (LWR) under SEM.

The resist composition is shown in Table 1 together with the sensitivity, resolution and LWR of EB lithography.

TABLE 1

| | | Polymer (pbw) | Acid generator (pbw) | Basic compound (pbw) | Crosslinker (pbw) | Organic solvent (pbw) | PEB temp. (°C.) | Sensitivity ($\mu C/cm^2$) | Resolution (nm) | LWR (nm) |
|---|---|---|---|---|---|---|---|---|---|---|
| Example | 1 | Polymer 1 (100) | PAG1 (20) | Amine1 (1.0) | CR1 (10) | PGMEA (2,000) | 95 | 26.6 | 75 | 6.2 |
| | 2 | Polymer 2 (1003) | PAG1 (20) | Amine1 (1.0) | — | PGMEA (1,500) CyH (500) | 95 | 26.6 | 75 | 6.3 |
| | 3 | Polymer 3 (100) | PAG1 (20) | Amine1 (1.0) | — | PGMEA (1,500) CyH (200) | 95 | 28.3 | 75 | 6.1 |
| | 4 | Polymer 4 (100) | — | Amine1 (1.0) | CR1 (10) | PGMEA (1,500) CyH (200) | 95 | 27.0 | 75 | 5.6 |
| | 5 | Polymer 5 (100) | PAG1 (20) | Amine1 (1.0) | — | CyH (500) CyP (1,800) | 100 | 26.3 | 75 | 6.2 |
| | 6 | Polymer 6 (100) | PAG1 (20) | Amine1 (1.0) | — | CyH (500) CyP (1,800) | 100 | 23.0 | 70 | 6.2 |
| | 7 | Polymer 7 (100) | PAG1 (20) | Quencher 1 (5.0) | — | CyH (500) CyP (1,800) | 100 | 23.0 | 70 | 5.8 |
| Comparative Example | 1 | Comparative Polymer 1 (100) | PAG1 (20) | Amine1 (1.0) | CR1 (10) | PGMEA (2,000) | 95 | 28.5 | 90 | 8.9 |
| | 2 | Comparative Polymer 2 (100) | PAG1 (20) | Amine1 (1.0) | CR1 (10) | PGMEA (2,000) | 95 | 33.6 | 90 | 8.9 |
| | 3 | Comparative Polymer 3 (100) | PAG1 (20) | Amine1 (1.0) | — | CyH (500) CyP (1,800) | 95 | 23.0 | 90 | 8.2 |
| | 4 | Comparative Polymer 4 (100) | PAG1 (20) | Amine1 (1.0) | — | CyH (500) CyP (1,800) | 95 | 23.0 | 80 | 7.2 |
| | 5 | Comparative Polymer 5 (100) | PAG1 (20) | Amine1 (1.0) | — | CyH (500) CyP (1,800) | 95 | 19.0 | 100 | 10.2 |

It is evident from Table 1 that the resist compositions of Examples 1 to 7 show high sensitivity, high resolution, and reduced edge roughness, as compared with the resist compositions of Comparative Examples 1 to 5.

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application No. 2013-013960 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified negative resist composition comprising a polymer as base resin, an acid generator and a crosslinker, said polymer comprising recurring units (a) and hydroxyl-containing recurring units (b), represented by the general formula (1):

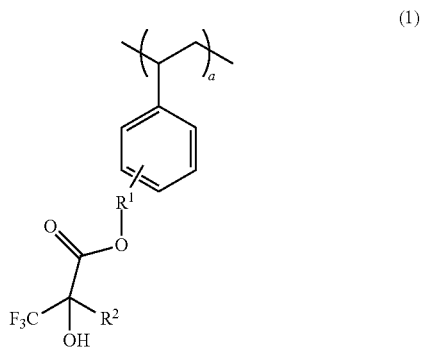

-continued

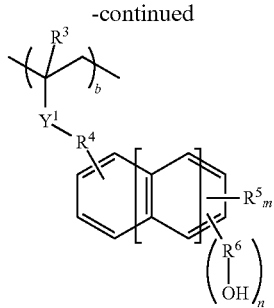

wherein $R^1$ is a straight $C_1$-$C_4$ alkylene group, $R^2$ is hydrogen, methyl or trifluoromethyl, $R^3$ is hydrogen or methyl, $Y^1$ is a single bond, —C(=O)—O— or —C(=O)—NH—, $R^4$ is a single bond or a straight or branched $C_1$-$C_6$ alkylene group, $R^5$ is hydrogen, fluorine, trifluoromethyl, cyano, or a straight, branched or cyclic $C_1$-$C_6$ alkyl, alkoxy, alkoxycarbonyl, acyl or acyloxy group, $R^6$ is a single bond or a straight, branched or cyclic $C_1$-$C_{12}$ alkylene group, m is an integer of 0 to 4, n is 1 or 2, a and b are in the range: $0<a<1.0$ and $0<b<1.0$.

2. The resist composition of claim 1 wherein the polymer has a weight average molecular weight of 1,000 to 500,000.

3. The resist composition of claim 1, further comprising at least one component selected from the group consisting of an organic solvent, basic compound, dissolution regulator, and surfactant.

4. A pattern forming process comprising the steps of: applying the negative resist composition of claim 1 onto a substrate, prebaking the composition to form a resist film, exposing a selected region of the resist film to high-energy radiation, and developing the exposed film in a developer to form a negative pattern wherein the unexposed region of resist film is dissolved away and the exposed region of resist film is not dissolved.

5. The process of claim 4 wherein the developer is an alkaline aqueous solution.

6. A pattern forming process comprising the steps of: applying the negative resist composition of claim 2 onto a substrate, prebaking the composition to form a resist film, exposing a selected region of the resist film to high-energy radiation, and developing the exposed film in a developer to form a negative pattern wherein the unexposed region of resist film is dissolved away and the exposed region of resist film is not dissolved.

7. A pattern forming process comprising the steps of: applying the negative resist composition of claim 1 onto a substrate, prebaking the composition to form a resist film, exposing a selected region of the resist film to high-energy radiation, and developing the exposed film in a developer to form a negative pattern wherein the unexposed region of resist film is dissolved away and the exposed region of resist film is not dissolved.

8. A pattern forming process comprising the steps of: applying the negative resist composition of claim 3 onto a substrate, prebaking the composition to form a resist film, exposing a selected region of the resist film to high-energy radiation, and developing the exposed film in a developer to form a negative pattern wherein the unexposed region of resist film is dissolved away and the exposed region of resist film is not dissolved.

9. The resist composition of claim 1 wherein the crosslinker is at least one compound selected from the group consisting of melamine compounds, guanamine compounds, glycoluril compounds and urea compounds having substituted thereon at least one group selected from among methylol, alkoxymethyl and acyloxymethyl groups, epoxy compounds, isocyanate compounds, azide compounds, and compounds having an alkenyl ether group.

* * * * *